(12) United States Patent
Shibusawa et al.

(10) Patent No.: US 7,333,079 B2
(45) Date of Patent: Feb. 19, 2008

(54) ORGANIC EL DISPLAY AND ACTIVE MATRIX SUBSTRATE

(75) Inventors: Makoto Shibusawa, Fukaya (JP); Yoshiro Aoki, Kitamoto (JP); Hirondo Nakatogawa, Kumagaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 374 days.

(21) Appl. No.: 11/186,949

(22) Filed: Jul. 22, 2005

(65) Prior Publication Data

US 2005/0269961 A1 Dec. 8, 2005

Related U.S. Application Data

(63) Continuation of application No. PCT/JP04/00367, filed on Jan. 19, 2004.

(30) Foreign Application Priority Data

| Jan. 22, 2003 | (JP) | ............................. 2003-013383 |
| May 15, 2003 | (JP) | ............................. 2003-137377 |
| May 16, 2003 | (JP) | ............................. 2003-139443 |

(51) Int. Cl.
*G09G 3/20* (2006.01)

(52) U.S. Cl. ..................... 345/76; 315/169.3

(58) Field of Classification Search ............... 345/76, 345/211, 82; 257/57, 291, 292; 315/169.3; 349/42, 139, 149; 313/505

See application file for complete search history.

(56) References Cited

U.S. PATENT DOCUMENTS 4,623,908 A 11/1986 Oshima et al.

(Continued)

FOREIGN PATENT DOCUMENTS

EP 1 130 565 9/2001

(Continued)

OTHER PUBLICATIONS

Yongtaek Hong, et al., P-103: Novel Poly-Si TFT Pixel Electrode Circuits and Current Programmed Active-Matrix Driving Methods for AM-OLEDs, Solid-State Electronics Lab., Dept. of EECS, The University of Michigan, Ann Arbor, MI, USA, SID 02 DIGEST, pp. 618-621.

(Continued)

*Primary Examiner*—Richard Hjerpe
*Assistant Examiner*—Abbas Abdulselam
(74) *Attorney, Agent, or Firm*—Oblon, Spivak, McClelland, Maier & Neustadt, P.C.

(57) ABSTRACT

In an active matrix organic EL display including a drive control element which has a first terminal connected to a first power supply terminal, a control terminal, and a second terminal which outputs a driving current having a magnitude corresponding to the voltage between the first terminal and the control terminal, a capacitor which has one electrode connected to the control terminal and can maintain the voltage between the first terminal and the control terminal constant, and an organic EL element connected between the second terminal and a second power supply terminal, a plurality of switches connected in series are used as switches between the second terminal and the control terminal to obtain a perfect nonconductive state, and the switch on the control terminal side is set in the nonconductive state earlier than the remaining switch, thereby decreasing the potential shift amount generated by the capacitance of the switches themselves.

17 Claims, 15 Drawing Sheets

U.S. PATENT DOCUMENTS

| | | | |
|---|---|---|---|
| 6,104,067 A | 8/2000 | Zhang et al. | |
| 6,229,506 B1 | 5/2001 | Dawson et al. | |
| 6,373,454 B1 | 4/2002 | Knapp et al. | |
| 2002/0180671 A1 | 12/2002 | Inukai | |
| 2005/0269961 A1 | 12/2005 | Shibusawa et al. | |

FOREIGN PATENT DOCUMENTS

| | | |
|---|---|---|
| JP | 4-293015 | 10/1992 |
| JP | 9-82969 | 3/1997 |
| JP | 2002-221936 | 8/2002 |
| JP | 2002-351357 | 12/2002 |
| JP | 2003-140611 | 5/2003 |
| JP | 2004-145241 | 5/2004 |
| WO | WO 01/75852 | 10/2001 |
| WO | WO 01/91094 | 11/2001 |
| WO | WO 01/91095 | 11/2001 |
| WO | WO 02/075711 A1 | 9/2002 |

OTHER PUBLICATIONS

Translation of International Written Opinion, Mar. 2, 2004.
U.S. Appl. No. 11/389,074, filed Mar. 27, 2006, Omata et al.

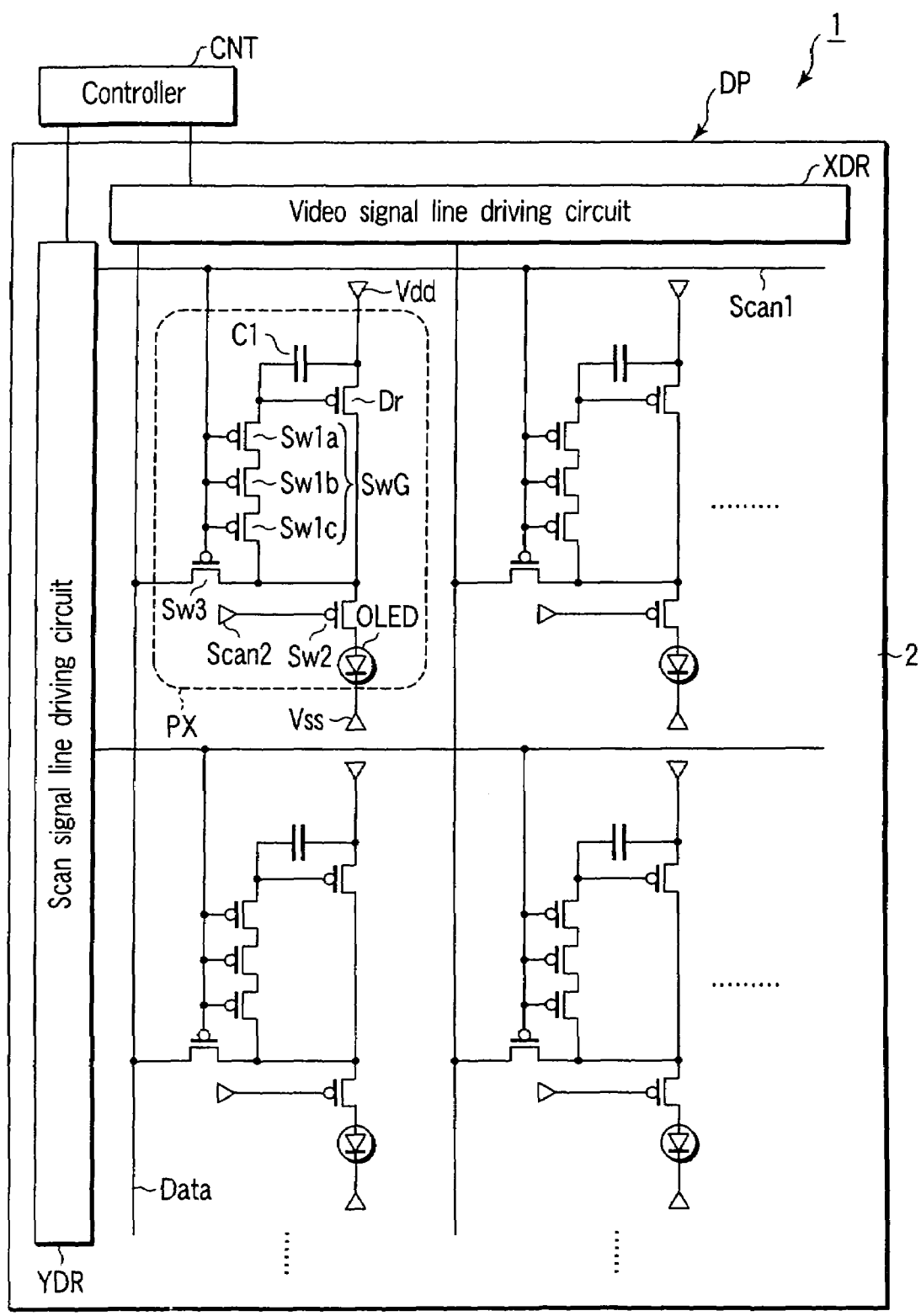
F I G. 2

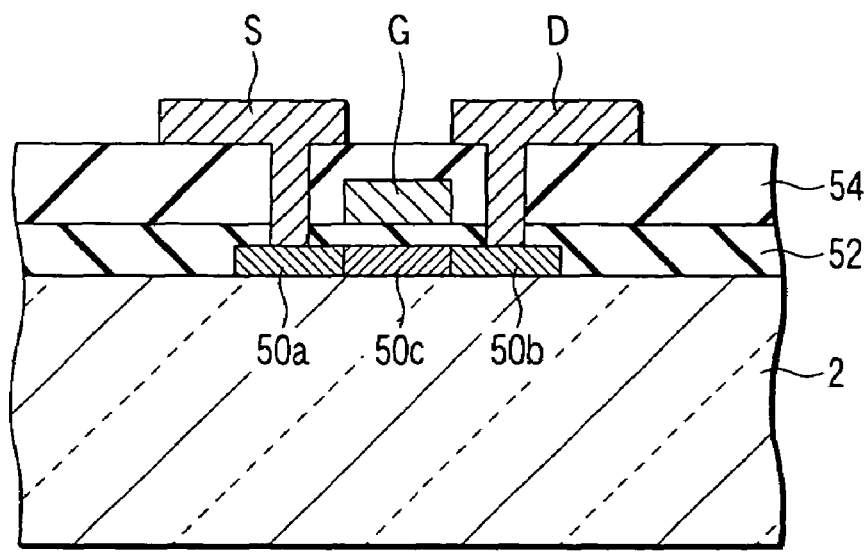
F I G. 6
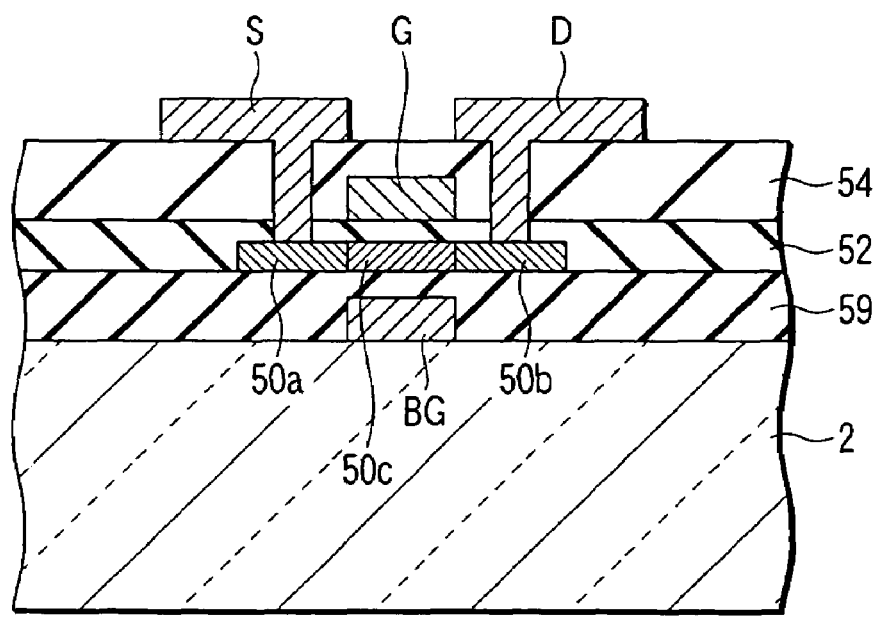
F I G. 7

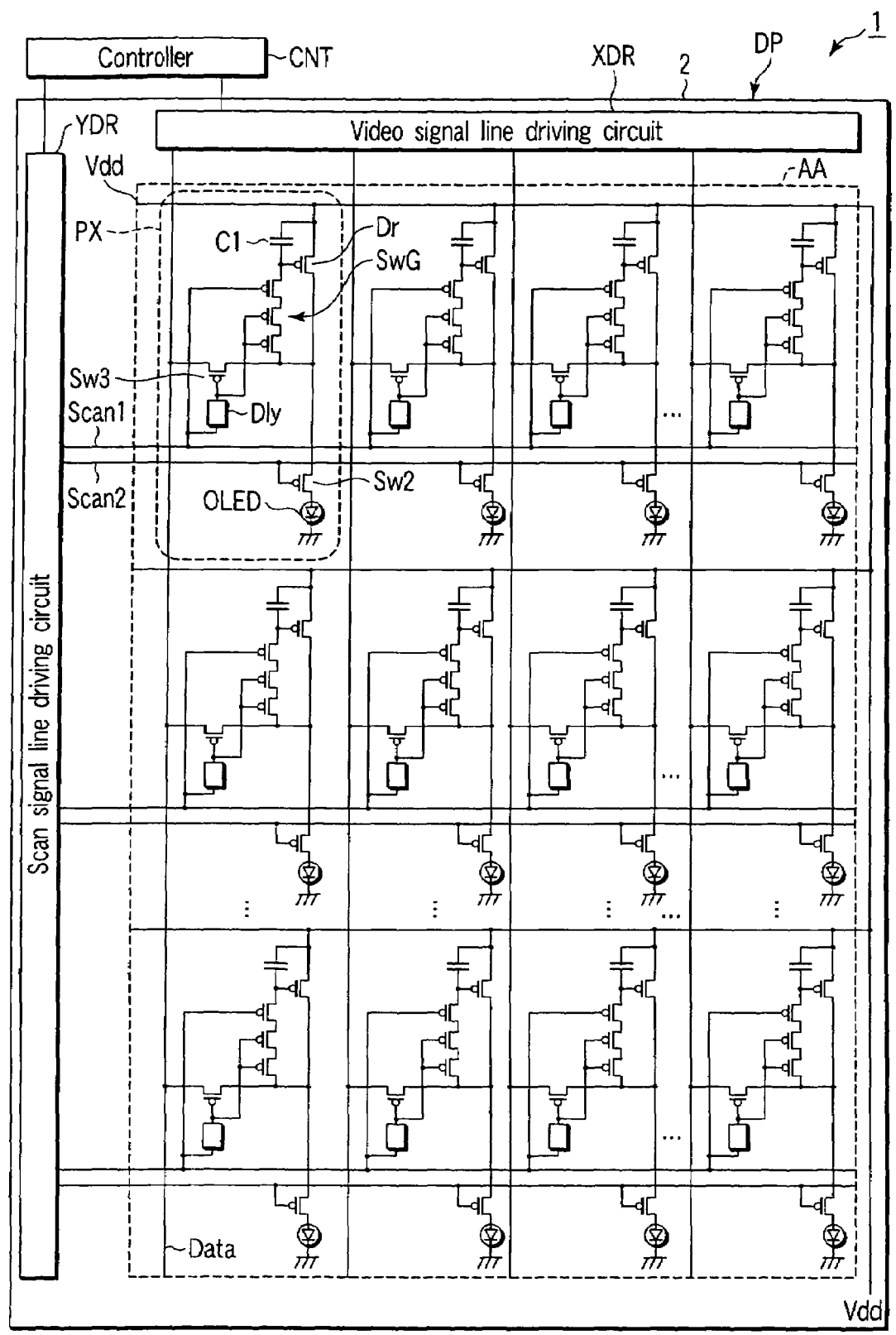
F I G. 8

US 7,333,079 B2

ORGANIC EL DISPLAY AND ACTIVE MATRIX SUBSTRATE

CROSS REFERENCE TO RELATED APPLICATIONS

This is a Continuation Application of PCT Application No. PCT/JP2004/000367, filed Jan. 19, 2004, which was published under PCT Article 21(2) in Japanese.

This application is based upon and claims the benefit of priority from prior Japanese Patent Applications No. 2003-013383, filed Jan. 22, 2003; No. 2003-137377, filed May 15, 2003; and No. 2003-139443, filed May 16, 2003, the entire contents of all of which are incorporated herein by reference.

BACKGROUND OF THE INVENTION

1. Field of the Invention

The present invention relates to a display and an array substrate and, more particularly, to an active matrix organic EL (electroluminescence) display and an active matrix substrate used therefore.

2. Description of the Related Art

Demand for flat panel displays represented by a liquid crystal display is growing sharply because of their advantages such as low profile, low weight, and low power consumption as compared to cathode-ray-tube displays. Especially, active matrix displays which use pixels having a memory effect to hold a video signal are used in various devices, such as portable information equipments, because a satisfactory display quality can be obtained.

In recent years, of flat panel displays, organic EL displays as self-emission displays which can increase the response speed and viewing angle as compared to liquid crystal displays have intensively been developed.

FIG. 1 is a circuit diagram showing an example of the pixel circuit of a conventional organic EL display. This pixel circuit is disclosed in U.S. Pat. No. 6,373,454B1 and operates as described below.

First, a switch Sw2 is opened. In this state, switches Sw1 and Sw3 are closed to supply a desired video signal current $I_{in}$ to a transistor Dr. At this time, since the transistor Dr is diode-connected by the switch Sw1, the gate-to-source voltage of the transistor Dr is set such that the magnitude of the current that flows between the source and drain equals the current $I_{in}$. After that, the switches Sw1 and Sw3 are opened. The gate-to-source voltage of the transistor Dr, which is set in correspondence with the current $I_{in}$, is held by a capacitor C1. In the above way, the write period is ended.

Next, the switch Sw2 is closed to connect an organic EL element OLED to the drain of the transistor Dr. Since the gate-to-source voltage of the transistor Dr is set as descried above, a current having almost the same magnitude as the current $I_{in}$ flows to the organic EL element OLED. Accordingly, the light emission period starts. Note that the light emission period continues until the next write period starts.

In the above-described display method, the gate-to-source voltage is ideally held at a constant level during the light emission period. However, if the switch Sw1 is incompletely turned off, charges can move between the gate and drain of the transistor Dr, and the gate-to-source voltage varies. As a result, image display corresponding to the written video signal may be difficult. For example, the luminance of dark display pixels may increase. In extreme cases, the dark display pixels may visually be recognized as bright defects.

This problem not only exists in an organic EL display whose pixels use the circuit shown in FIG. 1. More specifically, the above problem can also be exist in an organic EL display whose pixels use not the circuit which writes a video signal by a current signal but a circuit which writes a video signal by a voltage signal.

BRIEF SUMMARY OF THE INVENTION

It is an object of the present invention to increase the display quality of an active matrix organic EL display.

According to a first aspect of the present invention, there is provided an active matrix organic EL display comprising a drive control element which includes a first terminal connected to a first power supply terminal, a control terminal, and a second terminal which outputs a driving current having a magnitude corresponding to a voltage between the first terminal and the control terminal, a capacitor which has one electrode connected to the control terminal and can maintain the voltage between the first terminal and the control terminal constant, an organic EL element which is connected between the second terminal and a second power supply terminal, and a plurality of first switches which are connected in series between the second terminal and the control terminal.

According to a second aspect of the present invention, there is provided an active matrix organic EL display comprising a drive control element which includes a first terminal connected to a first power supply terminal, a control terminal, and a second terminal which outputs a driving current having a magnitude corresponding to a voltage between the first terminal and the control terminal, a capacitor which has one electrode connected to the control terminal and can maintain the voltage between the first terminal and the control terminal constant, an organic EL element which is connected between the second terminal and a second power supply terminal, and a plurality of first switches which are connected in series between the second terminal and the control terminal, the plurality of first switches being field effect transistors of the same conductivity type and having gates connected to a single scan signal input terminal, and of the plurality of first switches connected in series, the first switch located at an end on a side of the control terminal having a threshold value deeper than that of the remaining first switch.

According to a third aspect of the present invention, there is provided an active matrix organic EL display comprising a drive control element which includes a first terminal connected to a first power supply terminal, a control terminal, and a second terminal which outputs a driving current having a magnitude corresponding to a voltage between the first terminal and the control terminal, a capacitor which has one electrode connected to the control terminal and can maintain the voltage between the first terminal and the control terminal constant, an organic EL element which is connected between the second terminal and a second power supply terminal, and a plurality of first switches which are connected in series between the second terminal and the control terminal, the plurality of first switches being field effect transistors of the same conductivity type and having gates connected to a single scan signal input terminal, and of the plurality of first switches connected in series, the first switch located at an end on a side of the control terminal having a channel length longer than that of the remaining first switch.

According to a fourth aspect of the present invention, there is provided an active matrix organic EL display comprising a drive control element which includes a first terminal connected to a first power supply terminal, a control terminal, and a second terminal which outputs a driving current having a magnitude corresponding to a voltage between the first terminal and the control terminal, a capacitor which has one electrode connected to the control terminal and can maintain the voltage between the first terminal and the control terminal constant, an organic EL element which is connected between the second terminal and a second power supply terminal, a plurality of first switches which are connected in series between the second terminal and the control terminal, a first scan signal terminal which is connected to, of the plurality of first switches, a control terminal of the first switch located at an end on a side of the control terminal, and a second scan signal terminal which is connected to a control terminal of the remaining first switch of the plurality of first switches, the plurality of first switches being field effect transistors of the same conductivity type, and of the plurality of first switches connected in series, the first switch located at the end on the control terminal side having a channel area smaller than that of the remaining first switch.

According to a fifth aspect of the present invention, there is provided an active matrix substrate comprising a drive control element which includes a first terminal connected to a first power supply terminal, a control terminal, and a second terminal which outputs a driving current having a magnitude corresponding to a voltage between the first terminal and the control terminal and should be connected to a second power supply terminal through an organic EL element, a capacitor which has one electrode connected to the control terminal and can maintain the voltage between the first terminal and the control terminal constant, and a plurality of switches which are connected in series between the second terminal and the control terminal.

BRIEF DESCRIPTION OF THE SEVERAL VIEWS OF THE DRAWING

FIG. 2 is a plan view schematically showing an active matrix organic EL display according to the first embodiment of the present invention;

FIG. 6 is a sectional view schematically showing an example of a structure which can be employed for, of a plurality of switches included in a switch group, switches except a switch which is located at the end on the control terminal side of a drive control element;

FIG. 7 is a sectional view schematically showing an example of a structure which can be employed for, of the plurality of switches included in the switch group, the switch located at the end on the control terminal side of the drive control element;

FIG. 8 is a plan view schematically showing an organic EL display according to the second embodiment of the present invention;

DETAILED DESCRIPTION OF THE INVENTION

Figure 1:
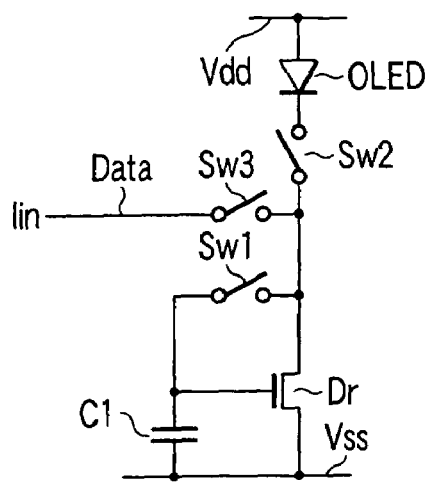
FIG. 1 is a circuit diagram showing an example of the pixel circuit of a conventional organic EL display.

Several embodiments of the present invention will be described below in detail with reference to the accompanying drawings. The same reference numerals denote constituent elements which exhibit the same or similar functions throughout the drawings, and a repetitive description thereof will be omitted.

FIG. 2 is a plan view schematically showing an active matrix organic EL display according to the first embodiment of the present invention.

An active matrix organic EL display 1 shown in FIG. 2 includes an organic EL panel DP and a controller CNT.

The organic EL panel DP includes an insulating substrate 2 such as a glass substrate. Pixels PX are arrayed in a matrix on one major surface of the substrate 2. The pixels PX define a display region on the major surface of the substrate 2. A scan signal line driver YDR and video signal line driver XDR as driving circuits are arranged in a region outside the display region, i.e., in the peripheral region.

Each pixel PX includes an organic EL element OLED, a drive control element Dr, a capacitor C1, a switch group SwG formed by connecting a plurality of switches in series, a switch Sw2, and a switch Sw3. As an example, the switch group SwG includes three switches Sw1a to Sw1c. As an example, p-channel TFTs (thin-film transistors) as a kind of field effect transistors are used as the drive control element Dr, switches Sw1a to Sw1c (switch group SwG), switch Sw2, and switch Sw3.

The drive control element Dr, switch Sw2, and organic EL element OLED are connected in this order in series between a power supply line Vdd and a power supply line Vss each serving as a power supply terminal which supplies, to the pixel PX, a power necessary for causing the organic EL element OLED to emit light. The potentials of the power supply line Vdd and power supply line Vss are set to, e.g., +10V and 0V, respectively.

A terminal of the capacitor C1 is connected to the control terminal (gate) of the drive control element Dr. The capacitor C1 holds the potential difference between the gate of the drive control element Dr and the terminal (source) of the drive control element Dr, which is connected to the power supply line Vdd. The potential difference corresponds to the input signal. The capacitor C1 is connected between the power supply line Vdd and the gate as the control terminal of the drive control element Dr.

The switches Sw1a to Sw1c are connected in series between the control terminal of the drive control element Dr and the terminal (drain) of the drive control element Dr, which is connected to the switch Sw2. The control terminals (gates) of the switches Sw1a to Sw1c are connected to the scan signal line driver YDR through the same control line for each pixel row. The control terminals of the switches Sw1a to Sw1c are connected to a scan signal line Scan1 to which the control terminal of the switch Sw3 is connected. The scan signal line which supplies a scan signal to the control terminals of the switches Sw1a to Sw1c may be arranged independently of the scan signal line Scan1.

The gate as the control terminal of the switch Sw2 is connected to a scan signal line Scan2.

The switch Sw3 is connected between a video signal line Data connected to the video signal line driver XDR and the terminal of the drive control element Dr, which is connected to the switch Sw2. The gate as the control terminal of the switch Sw3 is connected to the scan signal line driver YDR through the scan signal line Scan1.

The controller CNT is formed on a printed circuit board arranged outside the organic EL panel DP and controls the operations of the scan signal line driver YDR and video signal line driver XDR. The controller CNT receives a digital video signal and sync signal supplied from an external device and generates, on the basis of the sync signal, a vertical scan control signal which controls the vertical scan timing and a horizontal scan control signal which controls the horizontal scan timing. The controller CNT supplies the vertical scan control signal and horizontal scan control signal to the scan signal line driver YDR and video signal line driver XDR, respectively. In addition, the controller CNT supplies the digital video signal to the video signal line driver XDR in synchronism with the horizontal and vertical scan timings.

In each horizontal scan period, the video signal line driver XDR converts the digital video signal into an analog signal under the control of the horizontal scan control signal and supplies converted video signals parallelly to a plurality of video signal lines Data. In this example, the video signal line driver XDR supplies the video signal as a current signal to the video signal line Data.

Under the control of the vertical scan control signal, the scan signal line driver YDR sequentially supplies, to a plurality of scan signal lines Scan1, a scan signal which controls switching of the switches Sw1a to Sw1c and Sw3. Under the control of the vertical scan control signal, the scan signal line driver YDR also sequentially supplies, to a plurality of scan signal lines Scan2, a scan signal which controls switching of the switch Sw2.

In the display 1, the substrate 2, scan signal lines Scan1, video signal lines Data, switches Sw1a to Sw1c, Sw2, and Sw3, drive control elements Dr, and capacitors C1 form an active matrix substrate. As shown in FIG. 2, this active matrix substrate can also include the scan signal line driver YDR and video signal line driver XDR. This active matrix substrate can also include one electrode of each organic EL element OLED.

The driving method of the organic EL display 1 will be described next.

During the write period, first, a scan signal (in this case, a scan signal of High level) which sets the switch Sw2 in an unselected state is supplied from the scan signal line driver YDR to the scan signal line Scan2 connected to the pixel PX to be selected. In addition, a scan signal (in this case, a scan signal of Low level) which sets the switches Sw1a to Sw1c and Sw3 in a selected state is supplied to the scan signal line Scan1 connected to the pixel PX. Accordingly, the switch Sw2 is set in the nonconductive state, and the switches Sw1a to Sw1c and Sw3 are set in the conductive state.

In this state, a constant current having a magnitude equal to a video signal current $I_{in}$ is supplied by the video signal line driver XDR to a conductive path from the power supply line Vdd to the video signal line driver XDR via the drive control element Dr, switch Sw3, and video signal line Data. Since the switches Sw1a to Sw1c are in the conductive state, the potential difference (gate-to-source voltage) between the power supply line Vdd and the control terminal of the drive control element Dr is set to a value corresponding to the current $I_{in}$. After that, a scan signal (in this case, a scan signal of High level) which sets the switches Sw1a to Sw1c and Sw3 in the unselected state is supplied to the scan signal line Scan1 to set the switches Sw1a to Sw1c and Sw3 in the nonconductive state. The gate-to-source voltage of the drive control element Dr set in correspondence with the current $I_{in}$ is held by the capacitor C1. The write period is thus ended.

Next, a scan signal (in this case, a scan signal of Low level) which sets the switch Sw2 in the selected state is supplied to the scan signal line Scan2 to set the switch Sw2 in the conductive state. Since the gate-to-source voltage of the drive control element Dr is set as described above, a current having almost the same magnitude as the current $I_{in}$ flows to the organic EL element OLED. Accordingly, the light emission period starts. Note that the light emission period continues until the next write period starts.

In this embodiment, the terminal of the drive control element Dr connected to the switch Sw2 and the control terminal of the drive control element Dr, i.e., the drain and gate are connected to each other through the plurality of switches Sw1a to Sw1c connected in series. For this reason, during the light emission period, the voltage applied between the drain and gate of the drive control element Dr can be distributed to the switches Sw1a to Sw1c. As a result, during the light emission period, charges hardly move between the drain and gate of the drive control element Dr, and any variation in gate-to-source voltage is suppressed.

Even when one of the switches Sw1a to Sw1c causes a short circuit between the source and drain thereof, the nonconductive state of the entire switch Sw1 can be ensured as long as the remaining TFTs are normal. For this reason, a redundancy against pixel defects can be obtained. Hence, a satisfactory display operation can be performed. Especially, any increase in luminance of dark display pixels and generation of pixel defects can be suppressed.

In the display 1, for example, when switching from the conductive state to the nonconductive state of the plurality of switches Sw1a to Sw1c included in the switch group SwG progresses simultaneously, a display error such as an insufficient luminance of bright display pixels may occur. This problem can be solved by causing (ending) switching from the conductive state to the nonconductive state in accordance with the change in magnitude of the scan signal earlier in the switch Sw1a, which is the one among the plurality of switches Sw1a to Sw1c included in the switch group SwG that is located at the end on the control terminal side of the drive control element Dr, than in the remaining switches Sw1b and Sw1c. This will be described on the basis of an example in which timing control of switching of the switches Sw1a to Sw1c is done by using their threshold values.

Figure 3:
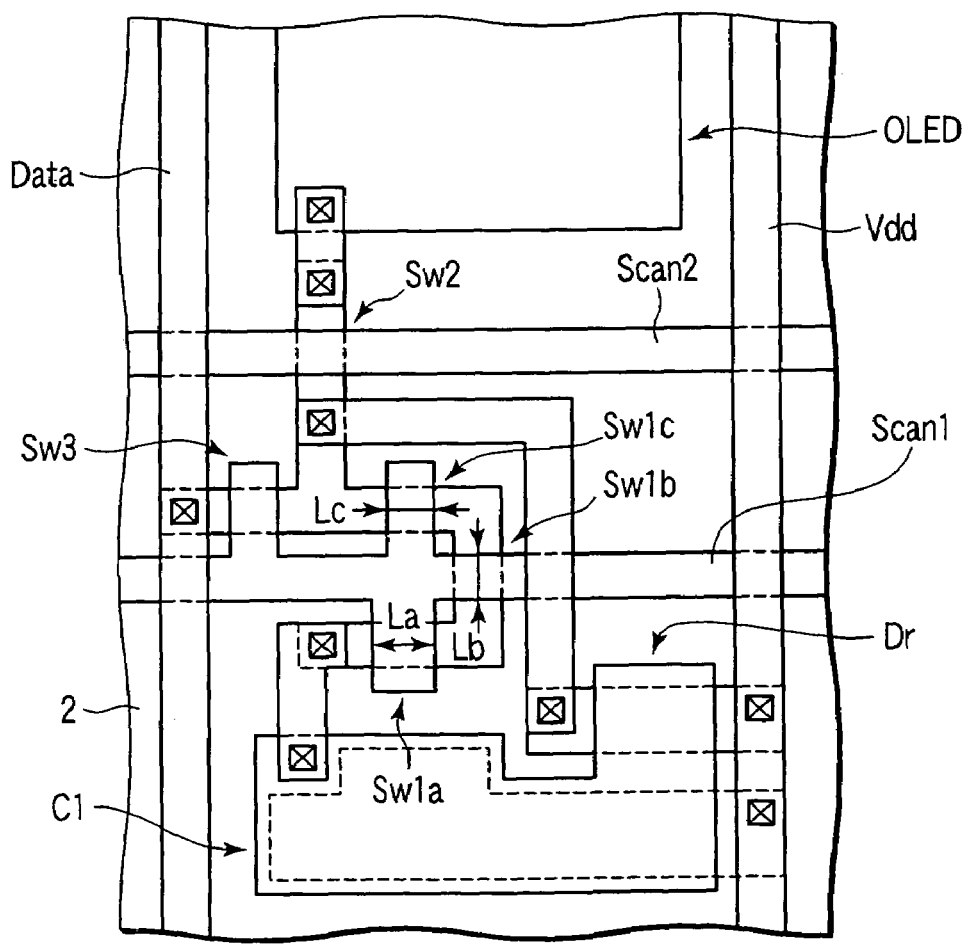
FIG. 3 is a plan view schematically showing an actual layout which can be employed for pixels in the organic EL display shown in FIG. 2.
Figure 5:
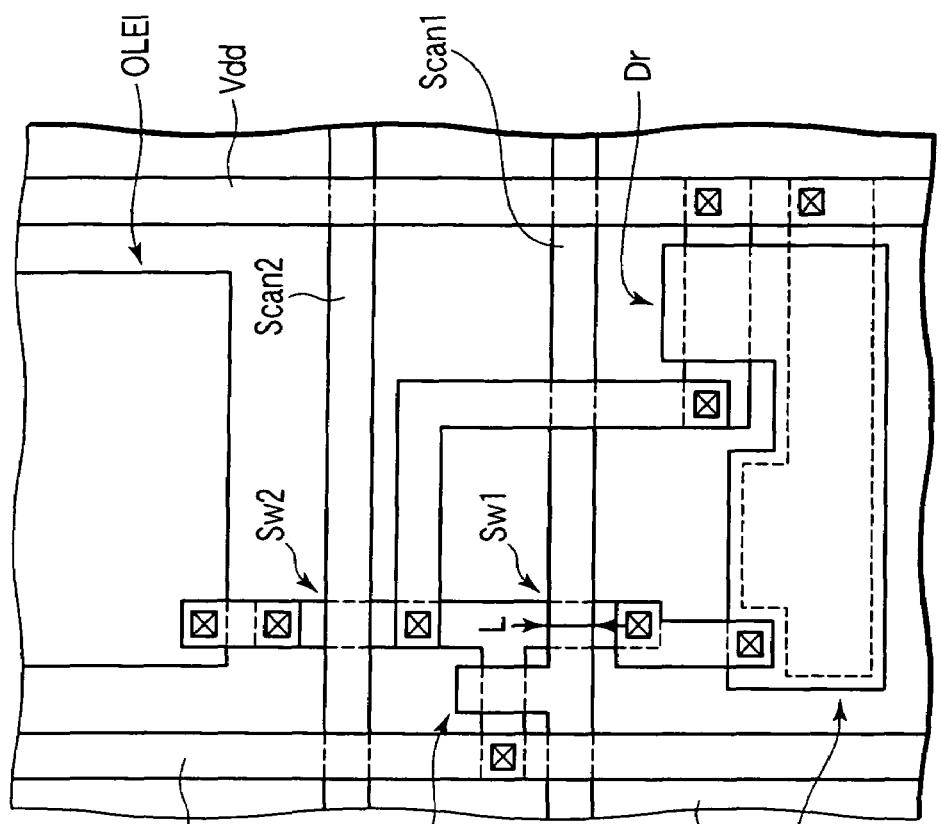
FIG. 5 is a plan view schematically showing an actual layout of the pixels of an organic EL display according to a reference example.
Figure 4:
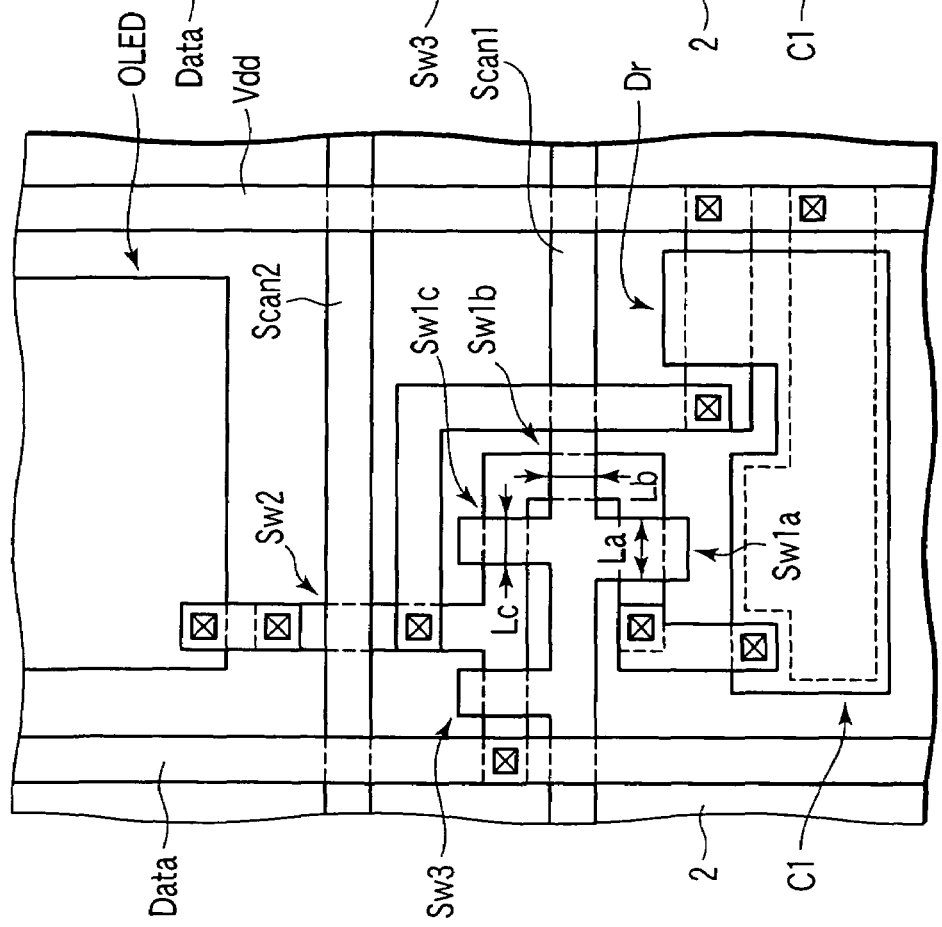
FIG. 4 is a plan view schematically showing a modification of the structure shown in FIG. 3.

FIG. 3 is a plan view schematically showing an actual layout which can be employed for the pixels PX in the organic EL display 1 shown in FIG. 2. FIG. 4 is a plan view schematically showing a modification of the structure shown in FIG. 3. FIG. 5 is a plan view schematically showing an actual layout of pixels of an organic EL display according to a reference example.

In the structure shown in FIG. 3, channel lengths La to Lc of transistors used as the switches Sw1a to Sw1c satisfy relations given by inequalities: La>Lb, and La>Lc (e.g., La=4.5 µm, Lb=Lc=3 µm). The structure shown in FIG. 4 is the same as that shown in FIG. 3 except that the channel lengths La to Lc equal each other (e.g., La=Lb=Lc=3 µm). The structure shown in FIG. 5 is the same as that shown in FIG. 3 except that only one switch Sw1 is arranged in place of the three switches Sw1a to Sw1c (e.g., channel length L=3 µm).

In the structure shown in FIG. 5, the drain and gate of the drive control element Dr are connected through only one switch Sw1. For this reason, during the light emission period, the drain-to-gate voltage of the drive control element Dr is wholly applied between the source and drain of the switch Sw1. Hence, when the structure shown in FIG. 5 is employed, charges readily move between the drain and gate of the drive control element Dr during the light emission period, resulting in, e.g., an increase in luminance of dark display pixels. In addition, if a short circuit occurs between the source and drain of the switch Sw1, pixel defects are generated.

On the other hand, in the structure shown in FIG. 4, the drain and gate of the drive control element Dr are connected through the three switches Sw1a to Sw1c connected in series. For this reason, during the light emission period, the drain-to-gate voltage of the drive control element Dr is distributed to the three switches Sw1a to Sw1c. Hence, when the structure shown in FIG. 4 is employed, charges hardly move between the drain and gate of the drive control element Dr during the light emission period. Accordingly, any increase in luminance of dark display pixels can be suppressed, as described above.

In the structures shown in FIGS. 4 and 5, the following phenomena occur as the magnitude of the scan signal is changed from Low level to High level to end the write period.

In the structure shown in FIG. 5, the switch Sw1 behaves as if it were a capacitor connected between the scan signal line Scan1 and the gate of the drive control element Dr. In the process for changing the magnitude of the scan signal from Low level to High level, charges hardly move between the drain and gate of the drive control element Dr. For this reason, as the magnitude of the scan signal changes from Low level to High level, the gate potential of the drive control element Dr rises. However, in the structure shown in FIG. 5, since the electrostatic capacitance of this capacitor is much smaller than that of the capacitor C1, the gate potential shift amount is very small. Hence, the influence of the gate potential shift on the image quality is small.

On the other hand, in the structure shown in FIG. 4, since the switches Sw1a to Sw1c have the same threshold value, switching from the conductive state to the nonconductive state progresses simultaneously. For this reason, until the switches Sw1a to Sw1c are completely set in the nonconductive state, they behave as if they were three capacitors connected in parallel between the scan signal line Scan1 and the control terminal of the drive control element Dr. In the structure shown in FIG. 4, the gate potential shift amount is about three times larger than that in the structure shown in FIG. 5. According to the structure shown in FIG. 4, a display error may occur in accordance with the gate potential shift.

To the contrary, in this embodiment, switching from the conductive state to the nonconductive state in accordance with the change in magnitude of the scan signal is caused (ended) earlier in the switch Sw1a, which is the one among the plurality of switches Sw1a to Sw1c included in the switch group SwG that is located at the end on the control terminal side of the drive control element Dr, than in the remaining switches Sw1b and Sw1c. The timing control is performed by, e.g., designing the switches Sw1a to Sw1c such that the threshold value of the switch Sw1a becomes deeper than those of the switches Sw1b and Sw1c. The threshold value control is done by, e.g., setting the channel lengths La to Lc of transistors used as the switches Sw1a to Sw1c to satisfy relations given by inequalities: La>Lb, and La>Lc, as shown in FIG. 3.

Under this timing control, the switch Sw1a behaves as if it were a capacitor connected to the gate of the drive control element Dr, as described above with reference to FIG. 4. However, when the switch Sw1a is set in the nonconductive state, the switches Sw1b and Sw1c are insulated from the gate of the drive control element Dr. For this reason, the switches Sw1b and Sw1c will not shift the gate potential of the drive control element Dr then. Ideally, of the switches Sw1a to Sw1c, only the switch Sw1a causes the gate potential shift.

When the switch Sw1a is regarded as a capacitor connected between the scan signal line Scan1 and the gate of the drive control element Dr, the electrostatic capacitance is proportional to the channel length La. For this reason, when the structure (La=4.5 µm) shown in FIG. 3 is employed, the influence of the switch Sw1a on the gate potential shift is about 1.5 times that in the structure (La=3 µm) shown in FIG. 4. However, as described above, when the structure shown in FIG. 4 is employed, not only the switch Sw1a but also the switches Sw1b and Sw1c shift the gate potential of the drive control element Dr. As a consequence, when the structure (La=4.5 μm) shown in FIG. 3 is employed, the gate potential shift amount is about ½ that in the structure (La=Lb=Lc=3 μm) shown in FIG. 4.

As described above, according to this embodiment, any large shift of the gate potential can be suppressed, and accordingly, any display error caused by the gate potential shift can be suppressed. That is, according to this embodiment, any variation in gate potential of the drive control element Dr by the leakage current can be suppressed while the switches connected between the gate and drain of the drive control element Dr are in the OFF state. Additionally, according to this embodiment, by controlling the OFF timing of each switch in the switch group SwG, any variation in gate potential of the drive control element Dr by the voltage punch-through in turning off the switches can be suppressed. Hence, a very high display quality can be implemented.

In this embodiment, for the plurality of switches Sw1a to Sw1c connected in series, the threshold value of the switch Sw1a located at the end on the control terminal side of the drive control element Dr preferably differs from those of the remaining switches Sw1b and Sw1c by about 0.1 to 0.8V. If the threshold values are to be controlled by the channel lengths, the channel length of the switch Sw1a is preferably about 1.3 to 3.0 times those of the remaining switches Sw1b and Sw1c. When the threshold values and channel lengths fall within the above ranges, the switch Sw1a and the switches Sw1b and Sw1c can be switched from the conductive state to the nonconductive state at sufficiently different timings while maintaining a sufficient small resistance value between the source and drain of the switch Sw1a in the conductive state.

In the above-described example, the threshold value is changed between the switch Sw1a and the switches Sw1b and Sw1c by using the channel lengths. The threshold value can also be changed by another method. For example, the impurity dose may be changed between the switch Sw1a and the switches Sw1b and Sw1c. For example, when p-channel TFTs are to be used as the switches Sw1a to Sw1c, the dose of the p-type dopant in the channels of the switches Sw1b and Sw1c is set larger than that in the channel of the switch Sw1a. Accordingly, the threshold values of the switches Sw1b and Sw1c can be shallower than that of the switch Sw1a. That is, the threshold value of the switch Sw1a is deeper than those of the switches Sw1b and Sw1c.

The switches Sw1a to Sw1c with different impurity doses can be formed by, e.g., the following method. In a normal TFT formation process, the number of times of impurity doping in the channel regions of the switches Sw1b and Sw1c is set larger than that in the channel region of the switch Sw1a. For example, first, the impurity is doped in the channel regions of the switches Sw1a to Sw1c. Next, the channel region of the switch Sw1a is masked by using a photoresist. The impurity is doped again in the channel regions of the switches Sw1b and Sw1c. With this process, the dose of the dopant in the channels of the switches Sw1b and Sw1c is larger than that of the p-type dopant in the channel of the switch Sw1a.

When the threshold value is to be changed between the switch Sw1a and the switches Sw1b and Sw1c by using the impurity dose, the dose preferably changes between the switches by about $1 \times 10^{11}$ cm$^{-2}$ to $5 \times 10^{11}$ cm$^{-2}$. In this case, the switch Sw1a can more reliably be set in the nonconductive state earlier than the switches Sw1b and Sw1c.

The threshold value of the switch Sw1a can be changed from those of the switches Sw1b and Sw1c by still another method.

FIG. 6 is a sectional view schematically showing an example of a structure which can be employed for, of the plurality of switches Sw1a to Sw1c included in the switch group SwG, the switches Sw1b and Sw1c except the switch that is located at the end on the control terminal side of the drive control element Dr. FIG. 7 is a sectional view schematically showing an example of a structure which can be employed for, of the plurality of switches Sw1a to Sw1c included in the switch group SwG, the switch Sw1a located at the end on the control terminal side of the drive control element Dr.

The switch shown in FIG. 6 is a top-gate type p-channel TFT. This TFT includes a semiconductor layer in which a source 50a, drain 50b, and channel 50c are formed. A predetermined amount of an impurity is implanted in source 50a and drain 50b. The channel 50c is formed between the source and drain. The channel 50c is intrinsic. Alternatively, an impurity is implanted in the channel 50c at a lower concentration than in the source 50a and drain 50b. A gate insulating film 52 is formed on the channel 50c. A gate G is arranged on the gate insulating film 52. The gate G is covered with an interlayer dielectric film 54. A source electrode S and drain electrode D are formed on the interlayer dielectric film 54. The source electrode S and drain electrode D are connected to the source 50a and drain 50b, respectively, via through holes formed in the gate insulating film 52 and interlayer dielectric film 54.

The switch shown in FIG. 7 has the same structure as that shown in FIG. 6 except that an insulating film 59 is formed under the channel 50c, and a back gate BG is arranged under the insulating film 59. A bias which makes the threshold value of the switch Sw1a deeper is applied to the back gate BG. For example, the voltage between the source 50a and back gate BG of the switch Sw1a is set to about +2.0V to +1.0V.

When the structure shown in FIG. 6 is employed for the switches Sw1b and Sw1c, and the structure shown in FIG. 7 is employed for the switch Sw1a, the threshold value of the switch Sw1a is deeper than those of the switches Sw1b and Sw1c. Even in this case, the switch Sw1a can be set in the nonconductive state earlier than the switches Sw1b and Sw1c.

FIGS. 6 and 7 show top-gate type TFTs. Instead, bottom-gate type thin-film transistors may be used as the switches Sw1a to Sw1c. In this case as well, when the back gate structure is employed for the switch Sw1a, its threshold value is deeper than those of the switches Sw1b and Sw1c. The back gate here means a gate which opposes the control terminal via a gate insulating film and semiconductor layer.

In the above embodiment, the switch group SwG includes the three switches Sw1a to Sw1c. The number of switches included in the switch group SwG can be two or more. In the above embodiment, p-channel transistors are used as all switches in the pixel PX. However, n-channel transistors may be used. Alternatively, p-channel transistors and n-channel transistors may be mixed.

As described above, the gate and drain of the drive control element Dr are connected through the switch group SwG including the plurality of switches Sw1a to Sw1c connected in series. Accordingly, the gate potential variation of the drive control element Dr during the light emission period can effectively be suppressed. Hence, any undesirable display operation error can be suppressed.

The control terminals in the switch group SwG are connected to the same control line Scan1 and controlled by the same scan signal. In this case, of the switches Sw1a to Sw1c of the switch group SwG, the threshold value of the switch Sw1a located at the end on the gate side of the drive control element Dr is set deeper than those of the remaining switches Sw1b and Sw1c. Accordingly, switching from the conductive state to the nonconductive state in accordance with the change in magnitude of the scan signal can be caused earlier in the switch Sw1a located at the end on the gate side of the drive control element Dr than in the remaining switches Sw1b and Sw1c. Hence, the undesirable gate potential variation of the drive control element Dr, which occurs at the end of the write period, can be minimized, and a satisfactory display operation can be performed.

The second embodiment of the present invention will be described next.

In the first embodiment, by controlling the threshold values in the switch group SwG, of the switches Sw1a to Sw1c included in the switch group SwG, the switch Sw1a located on the gate side of the drive control element Dr is controlled to be turned off earlier than the remaining switches Sw1b and Sw1c. In the second embodiment, the same effect as in the first embodiment is achieved by controlling the waveform of the scan signal to be supplied to a switch group SwG.

Figure 9:
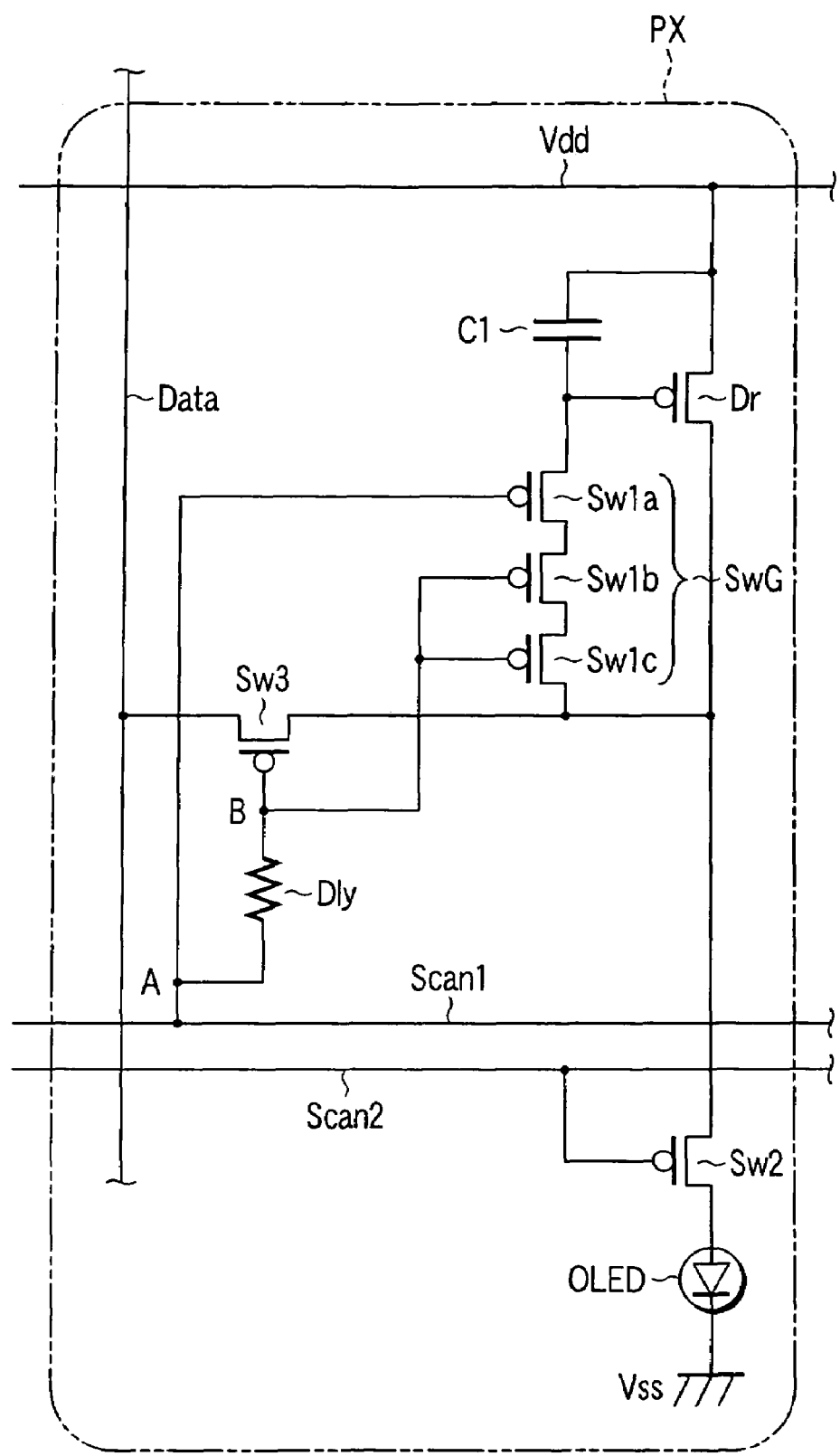
FIG. 9 is an equivalent circuit diagram showing an example of a pixel circuit which can be employed in the organic EL display shown in FIG. 8.

FIG. 8 is a plan view schematically showing an organic EL display according to the second embodiment of the present invention. FIG. 9 is an equivalent circuit diagram showing an example of a pixel circuit which can be employed in the organic EL display shown in FIG. 8. Referring to FIG. 8, reference symbol AA denotes a display region.

In an organic EL display 1 according to the second embodiment, each pixel PX has a delay element Dly which delays and outputs an input signal. In the second embodiment, the OFF timings of switches Sw1a to Sw1c included in the switch group SwG are controlled by the delay element Dly.

Of the switches Sw1a to Sw1c included in the switch group SwG, the control terminal of the switch Sw1a located at the end on the control terminal side of a drive control element Dr is directly connected to a scan signal line Scan1 that provides a scan signal input terminal to the pixel PX. The control terminals of the remaining switches Sw1b and Sw1c included in the switch group SwG are connected to the scan signal line Scan1 via the delay element Dly.

In this embodiment, as far as switching from the conductive state to the nonconductive state can be ended earlier in the switch Sw1a than in the switches Sw1b and Sw1c, the switches Sw1a to Sw1c can have either the same channel area or different channel areas. That is, channel lengths La to Lc of the switches Sw1a to Sw1c can be either equal or different. In addition, the switches Sw1a to Sw1c can have either the same channel width or different channel widths.

As an example, the channel length La of the switch Sw1a is set shorter than the channel length Lb of the switch Sw1b and the channel length Lc of the switch Sw1c. For example, the channel length La is set to 3 μm, and the channel lengths Lb and Lc are set to 4 to 9 μm. The channel widths of the switches Sw1a to Sw1c are set to 3 μm.

Of the switches Sw1a to Sw1c included in the switch group SwG, the control terminals of the switches Sw1b and Sw1c whose OFF timing should be delayed are connected to the scan line through the delay element Dly. With this structure, even when the control terminals of the switches Sw1a to Sw1c included in the switch group SwG are connected to the same scan signal line Scan1, switching from the conductive state to the nonconductive state in accordance with the change in magnitude of the scan signal can be caused earlier in the switch Sw1a, which is connected to the gate side of the drive control element Dr, than in the remaining switches Sw1b and Sw1c. Even in this embodiment, the same effect as in the first embodiment can be obtained.

In this embodiment, switching from the conductive state to the nonconductive state is ended earlier in the switch Sw1a than in a switch Sw3. This can be implemented by, e.g., connecting the control terminal of the switch Sw3 to the scan signal line Scan1 through the delay element Dly, as shown in FIGS. 8 and 9.

The pixel PX shown in FIG. 9 employs a resistive element as the delay element Dly. The resistance value of the resistive element is several GΩ and, for example, about 1 to 2 GΩ. The area of the resistive element is, e.g., about 400 to 1,000 μm$^{-2}$.

As the resistive element, a semiconductor layer having an LDD (Lightly Doped Drain) structure formed by, e.g., implanting an impurity at a low concentration or an intrinsic semiconductor layer can be used. The low concentration here means an impurity concentration lower than the concentration of the impurity implanted in the source and drain of a thin-film transistors and, for example, an impurity concentration of about $1\times10^{11}$ cm$^{-2}$ to $5\times10^{11}$ cm$^{-2}$. The concentration may equal the concentration in the channel of the thin-film transistor. When an intrinsic semiconductor layer is used, the area of the delay element Dly can be made smaller. For example, when TFTs having a top-gate type structure using polysilicon are used as the switches and drive control element Dr, and a polysilicon layer is used as the semiconductor layer included in the delay element Dly, the TFT manufacturing process can partially be used to manufacture the resistive element.

The driving method of the organic EL display 1 will be described next with reference to FIGS. 10 and 11.

Figure 10:
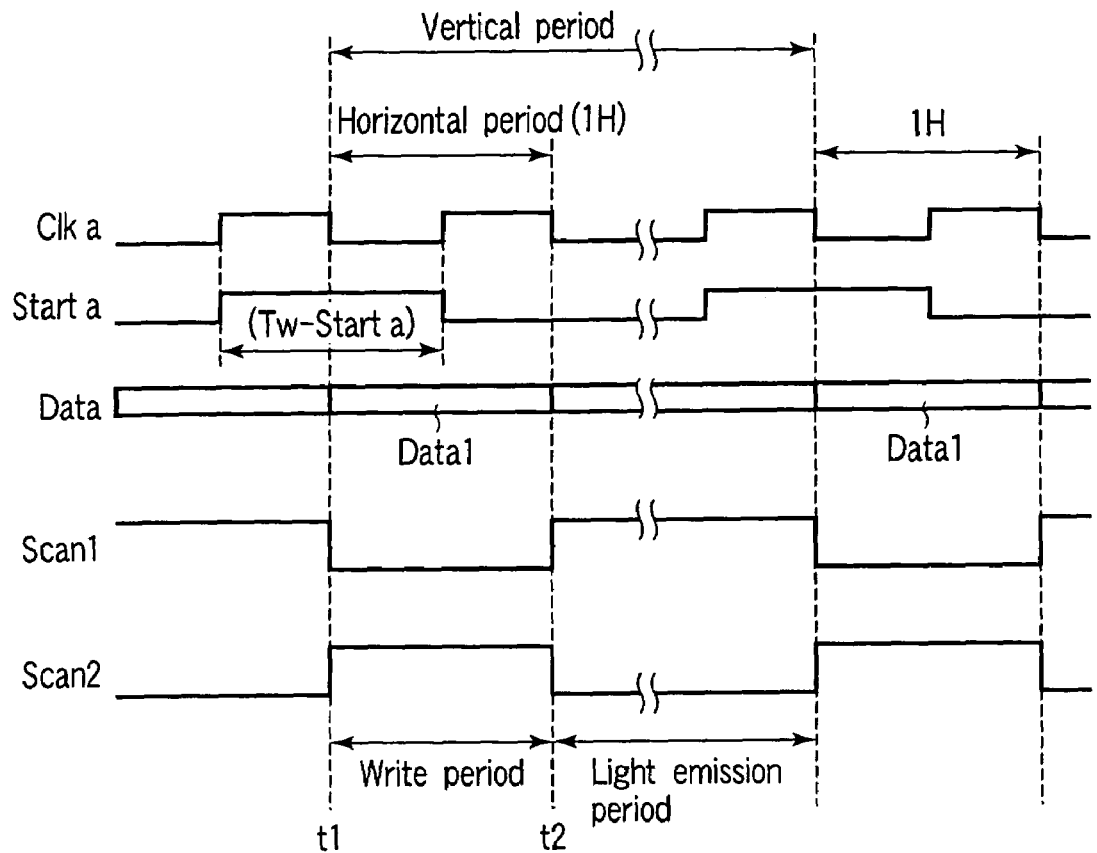
FIG. 10 is a timing chart showing an example of the driving method of the organic EL display shown in FIG. 8.
Figure 11:
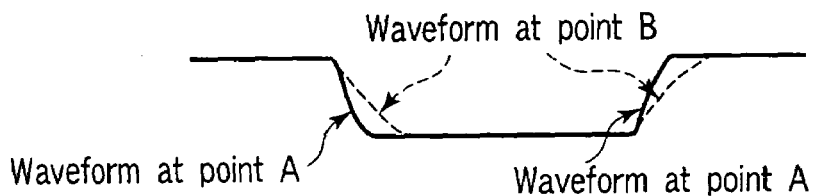
FIG. 11 is a view showing an example of the waveforms of a signal input to the delay element shown in FIG. 9 and a signal output from the delay element.

FIG. 10 is a timing chart showing an example of the driving method of the organic EL display shown in FIG. 8. FIG. 11 is a view showing an example of the waveforms of a signal (solid line) input to the delay element shown in FIG. 9 and a signal (dotted line) output from the delay element.

Referring to FIG. 10, "Clk a" and "Start a" indicate the waveforms of the clock signal and start signal supplied from a controller CNT to a scan signal line driver YDR, respectively. "Data" represents a state in which a video signal supplied from the scan signal line driver YDR to a video signal line Data changes for each horizontal scan period. "Scan1" and "Scan2" indicate the waveforms of scan signals supplied from the scan signal line driver YDR to the scan signal lines Scan1 and Scan2, respectively. Referring to FIG. 10, the waveforms of the signals are rectangular, for illustrative convenience. In fact, the leading and trailing edges of the signals are moderate because of the wiring resistance and capacitance.

The scan signal line driver YDR generates a pulse having a width Tw-Starta corresponding to each horizontal scan period from the clock signal and start signal. The scan signal line driver YDR sequentially supplies this pulse to the scan signal line Scan1 as an ON signal which sets the switches Sw1a to Sw1c and Sw3 in the conductive state. The scan signal line driver YDR sequentially supplies a signal obtained by inverting the pulse to the scan signal line Scan2 as an OFF signal which sets a switch Sw2 in the nonconductive state.

As shown in the timing chart of FIG. 10, the organic EL display 1 according to this embodiment can be driven by the same method as described in the first embodiment.

In this embodiment, the scan signal line Scan1 and the control terminals of the switches Sw1b, Sw1c, and Sw3 are connected through the delay element Dly. A resistive element is used as the delay element Dly. As shown in FIG. 11, the delay element Dly moderates the leading and trailing edges of the received scan signal and outputs the scan signal to the control terminals of the switches Sw1b, Sw1c, and Sw3. On the other hand, the same scan signal as that input to the delay element Dly is supplied to the control terminal of the switch Sw1a.

For example, even when the threshold value of the switch Sw1a and those of the switches Sw1b, Sw1c, and Sw3 almost equal each other, the switch Sw1a can be set in the nonconductive state earlier than the switches Sw1b, Sw1c, and Sw3 by supplying the OFF signal from the scan signal line driver YDR to the scan signal line Scan1.

In this embodiment, the channel area of the switch Sw1a can be smaller than that of the switch Sw1b and that of the channel Sw1c. For example, as described above, the switches Sw1a to Sw1c may have the same channel width, and the channel length La of the switch Sw1a may be shorter than the channel length Lb of the switch Sw1b and the channel length Lc of the channel Sw1c.

As described in the first embodiment, when the magnitude of the scan signal supplied from the scan signal line Scan1 to the gates of the switches Sw1a to Sw1c changes from Low level to High level, the gate potential of the drive control element Dr shifts because of the parasitic capacitance between the gate and drain of the switch Sw1a. When the channel area of the switch Sw1a is made small, the gate potential shift amount can be decreased. Hence, any display error caused by the gate potential shift can more effectively be prevented.

When the cannel length of the switch Sw1a is shorter than those of the switches Sw1b, Sw1c, and Sw3, the threshold value of the switch Sw1a is shallower than those of the switches Sw1b, Sw1c, and Sw3. If the difference between the waveform of the signal input to the delay element Dly and that of the signal output from the delay element Dly is small, it is difficult to complete switching from the conductive state to the nonconductive state earlier in the switch Sw1a than in the switches Sw1b, Sw1c, and Sw3.

When a resistive element having a larger resistance value is used as the delay element Dly, the difference between the waveform of the signal input to the delay element Dly and that of the signal output from the delay element Dly can be made large. To complete switching from the conductive state to the nonconductive state earlier in the switch Sw1a than in the switches Sw1b, Sw1c, and Sw3, a resistive element having a sufficiently large resistance value is used as the delay element Dly.

When a resistive element is used as the delay element Dly, the time lag between the OFF operation of the switch Sw1a and that of the switches Sw1b and Sw1c can be changed in accordance with the resistance value of the delay element Dly. The time lag is set to, e.g., 0.2 μs or more and, more preferably, 1 μs or more.

In the above example, a resistive element is used as the delay element Dly. The waveform of the signal to be supplied to the switch Sw1a and that of the signal to be supplied to the switches Sw1b and Sw1c may be changed by another method. For example, a diode may be used as the delay element Dly.

Figure 12:
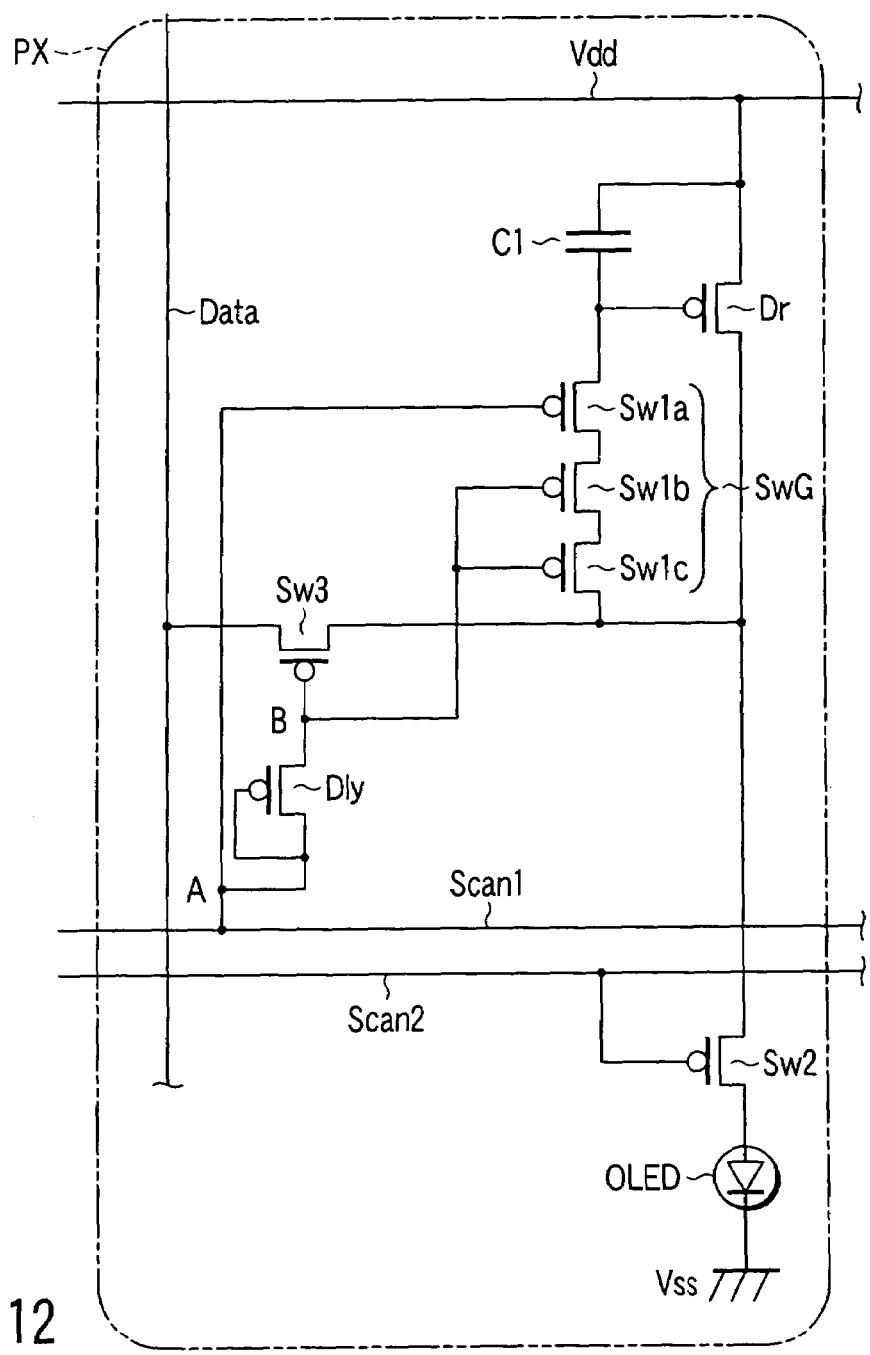
FIG. 12 is an equivalent circuit diagram showing another example of the pixel circuit which can be employed by the organic EL display shown in FIG. 8.

FIG. 12 is an equivalent circuit diagram showing another example of the pixel circuit which can be employed by the organic EL display shown in FIG. 8.

In the pixel PX shown in FIG. 12, a diode connected to supply a forward current from the control terminals of the switches Sw1b, Sw1c, and Sw3 to the scan signal line Scan1 is used as the delay element Dly. When the pixel circuit shown in FIG. 12 is used in the organic EL display 1 shown in FIG. 8, the display 1 can be driven by the same method as described in the first embodiment or with reference to FIG. 10.

Figure 13:
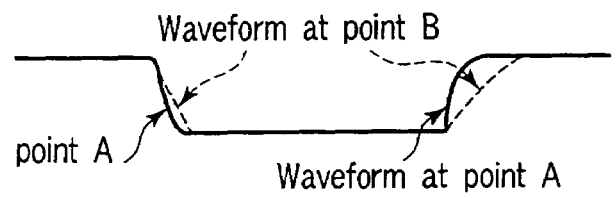
FIG. 13 is a view showing an example of the waveforms of a signal input to the delay element shown in FIG. 12 and a signal output from the delay element.

FIG. 13 is a view showing an example of the waveforms of a signal input to the delay element shown in FIG. 12 and a signal output from the delay element.

As shown in FIG. 13, when a diode is used as the delay element Dly, a forward current flows to the delay element Dly when the scan signal supplied from the scan signal line driver YDR to the scan signal line Scan1 falls. For this reason, the ON signal is supplied to the control terminals of the switches Sw1b, Sw1c, and Sw3 without any delay or with a small delay from the trailing edge of the scan signal. When the scan signal rises, a reverse bias is applied to the delay element Dly, and a leakage current flows to the delay element Dly. For this reason, the OFF signal is supplied to the control terminals of the switches Sw1b, Sw1c, and Sw3 with a delay from the leading edge of the scan signal. That is, even in the pixel circuit shown in FIG. 12, the OFF signal supplied to the control terminals of the switches Sw1b, Sw1c, and Sw3 delays from the OFF signal supplied to the control terminal of the switch Sw1a. Also in this example, the same effect as described in the first embodiment can be obtained.

When a diode is used as the delay element Dly, the OFF signal can be delayed almost without delaying the ON signal. For this reason, a high-speed write can be executed as compared to a case in which both the ON signal and OFF signal are delayed.

In this embodiment, a TFT whose gate is connected to the source, i.e., a diode-connected TFT can be used as the delay element Dly, as shown in, e.g., FIG. 12.

When a diode-connected p-channel TFT is used as the delay element Dly, the delay element Dly and the switches Sw1a to Sw1c, Sw2, and Sw3 can be formed simultaneously in the same process.

When a diode-connected TFT is used as the delay element Dly, the magnitude of the delay of the ON signal and that of the OFF signal can be adjusted in accordance with a ratio W/L of a channel width W to a channel length L of the TFT used as the delay element Dly.

The signal waveform to be supplied to the switch Sw1a can be changed from those to be supplied to the switches Sw1b and Sw1c by still another method. For example, a pair of diodes connected in parallel may be used as the delay element Dly.

Figure 14:
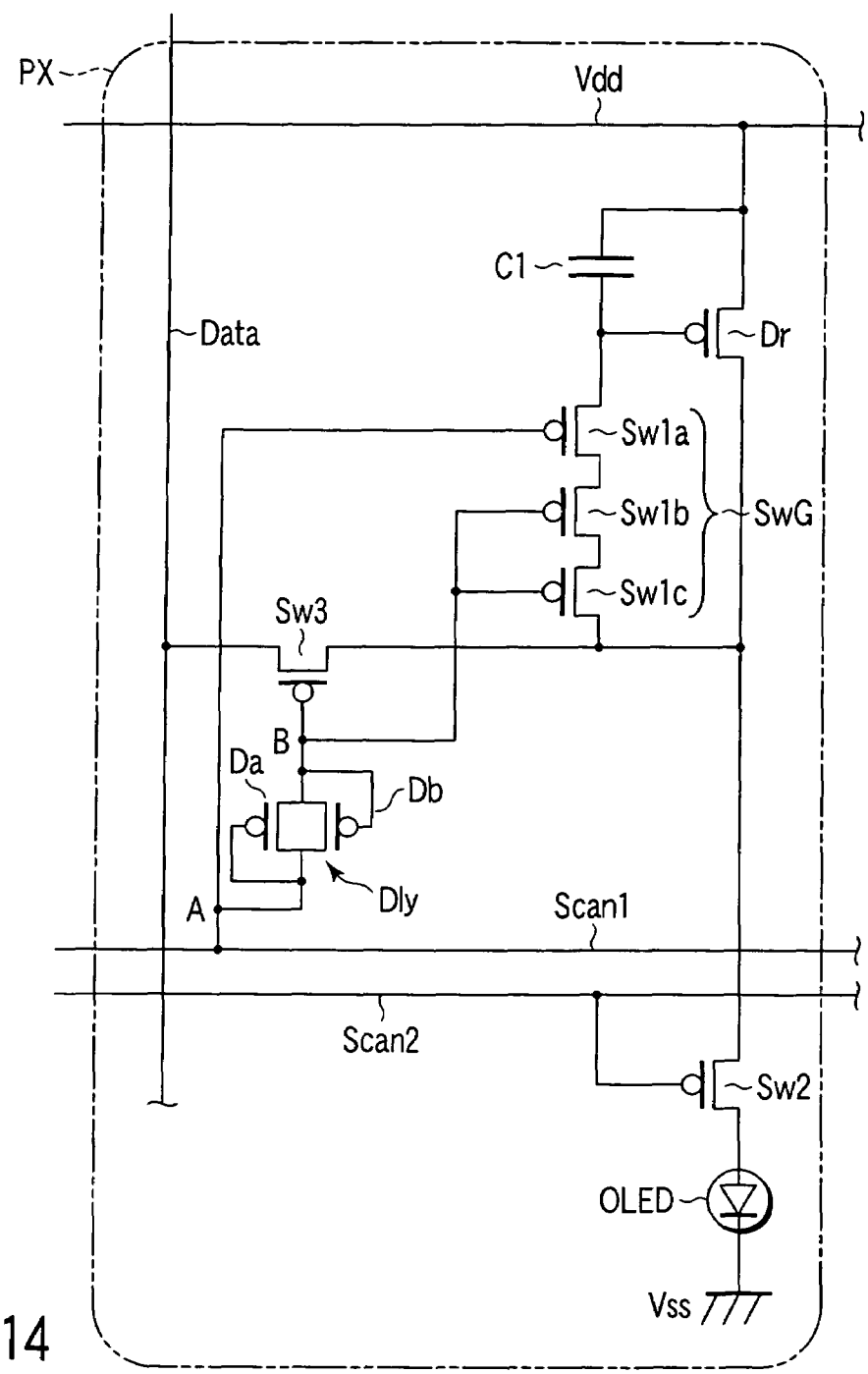
FIG. 14 is an equivalent circuit diagram showing another example of the pixel circuit which can be employed by the organic EL display shown in FIG. 8.

FIG. 14 is an equivalent circuit diagram showing still another example of the pixel circuit which can be employed in the organic EL display shown in FIG. 8.

In the pixel PX shown in FIG. 14, diodes Da and Db connected in parallel between the scan signal line Scan1 and the control terminals of the switches Sw1b, Sw1c, and Sw3 are used as the delay element Dly. The diode Da is connected to supply a forward current from the control terminals of the switches Sw1b, Sw1c, and Sw3 to the scan signal line Scan1. The diode Db is connected to supply a forward current from the scan signal line Scan1 to the control terminals of the switches Sw1b, Sw1c, and Sw3. When the pixel circuit shown in FIG. 14 is employed in the organic EL display 1 shown in FIG. 8, the display 1 can be driven by the same method as described in the first embodiment or with reference to FIG. 10.

Figure 15:
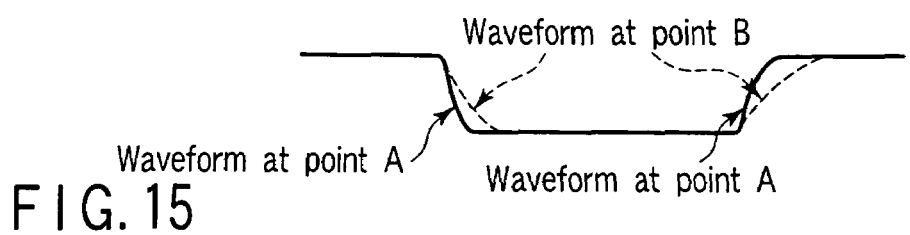
FIG. 15 is a view showing an example of the waveforms of a signal input to the delay element shown in FIG. 14 and a signal output from the delay element.

FIG. 15 is a view showing an example of the waveforms of a signal (solid line) input to the delay element shown in FIG. 14 and a signal (dotted line) output from the delay element.

As shown in FIG. 15, when the diodes Da and Db are used as the delay element Dly, a forward current flows to the diode Da when the scan signal supplied from the scan signal line driver YDR to the scan signal line Scan1 falls. The ON signal is supplied to the control terminals of the switches Sw1b, Sw1c, and Sw3 with a delay from the trailing edge of the scan signal. When the scan signal rises, a forward current flows to the diode Db. The OFF signal is supplied to the control terminals of the switches Sw1b, Sw1c, and Sw3 with a delay from the leading edge of the scan signal. That is, in this example too, the same effect as described in the first embodiment can be obtained.

In this example, the forward currents which flow to the diodes Da and Db are used as the ON signal and OFF signal to be supplied to the control terminals of the switches Sw1b, Sw1c, and Sw3. For this reason, the delay of the OFF signal can be controlled independently of the delay of the ON signal.

In this example, diode-connected TFTs can be used as the diodes Da and Db, as shown in, e.g., FIG. 14. When diode-connected p-channel TFTs are used as the diodes Da and Db, the diodes Da and Db and the switches Sw1a to Sw1c, Sw2, and Sw3 can be formed simultaneously in the same process.

When diode-connected TFTs are used as the diodes Da and Db, the magnitude of the delay of the ON signal and that of the OFF signal can be adjusted in accordance with the ratio W/L of the channel width W to the channel length L of the TFTs used as the diodes Da and Db.

The third embodiment of the present invention will be described next. In the second embodiment, the pixel PX employs a current driving type pixel circuit. In the third embodiment, a pixel PX employs a voltage driving type pixel circuit. Except for this point, the third embodiment is the same as the second embodiment.

Figure 16:
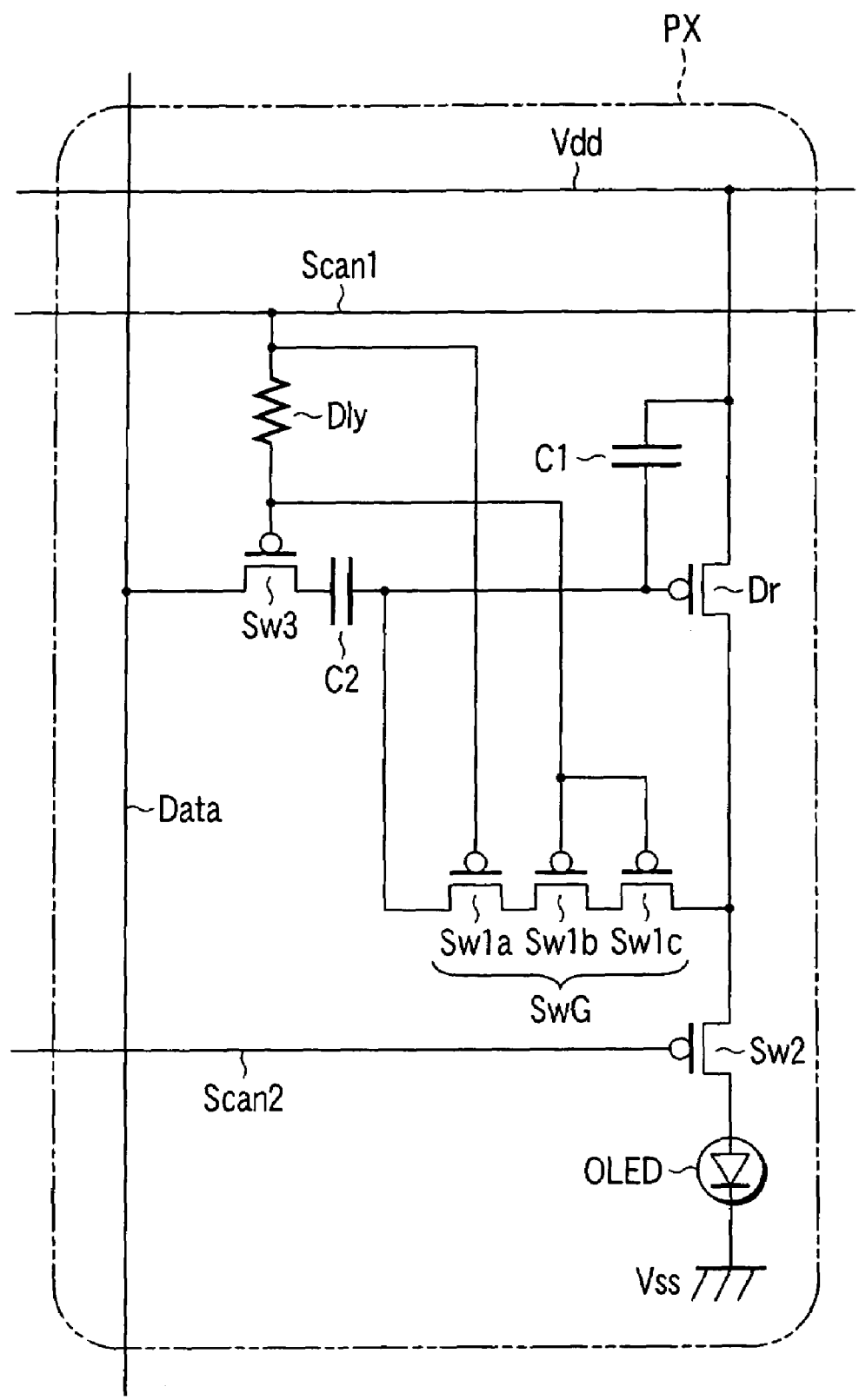
FIG. 16 is an equivalent circuit diagram showing an example of a pixel circuit which can be employed in an active matrix organic EL display according to the third embodiment of the present invention.

FIG. 16 is an equivalent circuit diagram showing an example of a pixel circuit which can be employed in an active matrix organic EL display according to the third embodiment of the present invention. The pixel PX includes an organic EL element OLED, a drive control element Dr, a capacitor C1, a capacitor C2, a delay element Dly, a switch group SwG formed by connecting a plurality of switches in series, a switch Sw2, and a switch Sw3. As an example, the switch group SwG includes three switches Sw1a to Sw1c. As an example, p-channel TFTs are used as the drive control element Dr, switches Sw1a to Sw1c, switch Sw2, and switch Sw3.

The drive control element Dr, switch Sw2, and organic EL element OLED are connected in this order in series between a power supply line Vdd and a power supply line Vss.

A terminal of the capacitor C1 is connected to the control terminal of the drive control element Dr. The capacitor C1 holds the potential difference between the gate and source of the drive control element Dr, which corresponds to the input signal. The capacitor C1 is connected between the power supply line Vdd and the gate as the control terminal of the drive control element Dr.

The switches Sw1a to Sw1c are connected in series between the control terminal of the drive control element Dr and the terminal of the drive control element Dr, which is connected to the switch Sw2. The control terminal of the switch Sw1a is directly connected to a scan signal line Scan1. On the other hand, the control terminals of the switches Sw1b and Sw1c are connected to the scan signal line Scan1 through the delay element Dly.

The control terminal of the switch Sw2 is connected to a scan signal line Scan2.

The switch Sw3 and capacitor C2 are connected in series between a video signal line Data and the control terminal of the drive control element Dr. The control terminal of the switch Sw3 is connected to the scan signal line Scan1 through the delay element Dly.

When the pixel PX employs the pixel circuit shown in FIG. 16, a video signal line driving circuit XDR capable of supplying, as a video signal, a voltage signal to the video signal line Data is used.

In an organic EL display 1, a substrate 2, scan signal lines Scan1 and Scan2, video signal lines Data, power supply line Vdd, switches Sw1a to Sw1c, Sw2, and Sw3, drive control elements Dr, capacitors C1 and C2, and delay elements Dly form an active matrix substrate. This active matrix substrate can also include a scan signal line driver YDR and the video signal line driver XDR. This active matrix substrate can also include one electrode of each organic EL element OLED.

The organic EL display 1 which employs the pixel circuit shown in FIG. 16 for the pixel PX can be driven by, e.g., the following method.

During the write period, first, an ON signal which sets the switches Sw1a to Sw1c and Sw3 in a selected state is supplied from the scan signal line driver YDR to the scan signal line Scan1 connected to the pixel PX to be selected. In addition, an OFF signal which sets the switch Sw2 in an unselected state is supplied to the scan signal line Scan2 connected to the pixel PX. Accordingly, the switch Sw2 is set in the nonconductive state, and the switches Sw1a to Sw1c and Sw3 are set in the conductive state.

In this state, the potential of the video signal line Data is set to a reset signal voltage $V_{rst}$ by the video signal line driver XDR. Since the switches Sw1a to Sw1c are in the conductive state, the potential difference (gate-to-source voltage) between the power supply line Vdd and the control terminal of the drive control element Dr is set to a threshold voltage $V_{th}$ of the drive control element Dr.

After that, an OFF signal which sets the switches Sw1a to Sw1c and Sw3 in the unselected state is supplied to the scan signal line Scan1. First, the switch Sw1a is set in the nonconductive state. Next, the switches Sw1b, Sw1c, and Sw3 are set in the nonconductive state. During the period after the switch Sw1a is set in the nonconductive state until the switch Sw3 is set in the nonconductive state, a video signal Vin is supplied from the video signal line driver XDR to the video signal line Data. If the electrostatic capacitances of the capacitors C1 and C2 equal each other, the gate potential of the drive control element Dr varies from the threshold voltage $V_{th}$ by an amount equal to the change amount from $V_{rst}$ to $V_{in}$.

Next, an ON signal which sets the switch Sw2 in the selected state is supplied to the scan signal line Scan2 to set the switch Sw2 in the conductive state. Since the gate-to-source voltage of the drive control element Dr is set as described above, a current having a magnitude corresponding to the difference between $V_{rst}$ and $V_{in}$ flows to the organic EL element OLED. Accordingly, the light emission period starts. The light emission period continues until the next write period starts.

In this embodiment, the terminal of the drive control element Dr connected to the switch Sw2 and the control terminal of the drive control element Dr, i.e., the drain and gate of the drive control element Dr are connected to each other through the plurality of switches Sw1a to Sw1c connected in series. For this reason, as in the first embodiment, during the light emission period, charges hardly move between the drain and gate of the drive control element Dr, and any variation in gate-to-source voltage can be suppressed.

In this embodiment, the switch Sw1a is set in the nonconductive state earlier than the switches Sw1b and Sw1c. Even in this embodiment, any large shift of the gate potential can be suppressed, as in the first embodiment.

That is, also in this embodiment, the same effect as in the first embodiment can be obtained, and a very high display quality can be implemented.

In this embodiment, an arrangement capable of controlling the operation of the switch Sw3 indepndlety of the operations of the switches Sw1a to Sw1c may be employed. For example, the operations of the switches Sw1a to Sw1c may be controlled by using the scan signal line Scan1, and a scan signal line to control the operation of the switch Sw3 may be arranged independently of the scan signal line Scan1.

In this embodiment, a resistive element shown in, e.g., FIG. 16 can be used as the delay element Dly. Alternatively, the diode described in the second embodiment may be used as the delay element Dly.

The fourth embodiment of the present invention will be described next.

In the first to third embodiments, the switches included in the switch group SwG are connected to the same control line. In the fourth embodiment, the control line connected to the control terminal of a switch, which is one of the switches included in a switch group SwG and located at the end on the gate side of a drive control element Dr, is arranged independently of the control line connected to the control terminals of the remaining switches. In the fourth embodiment, with this structure, the same effect as in the first to third embodiments is achieved.

Figure 17:
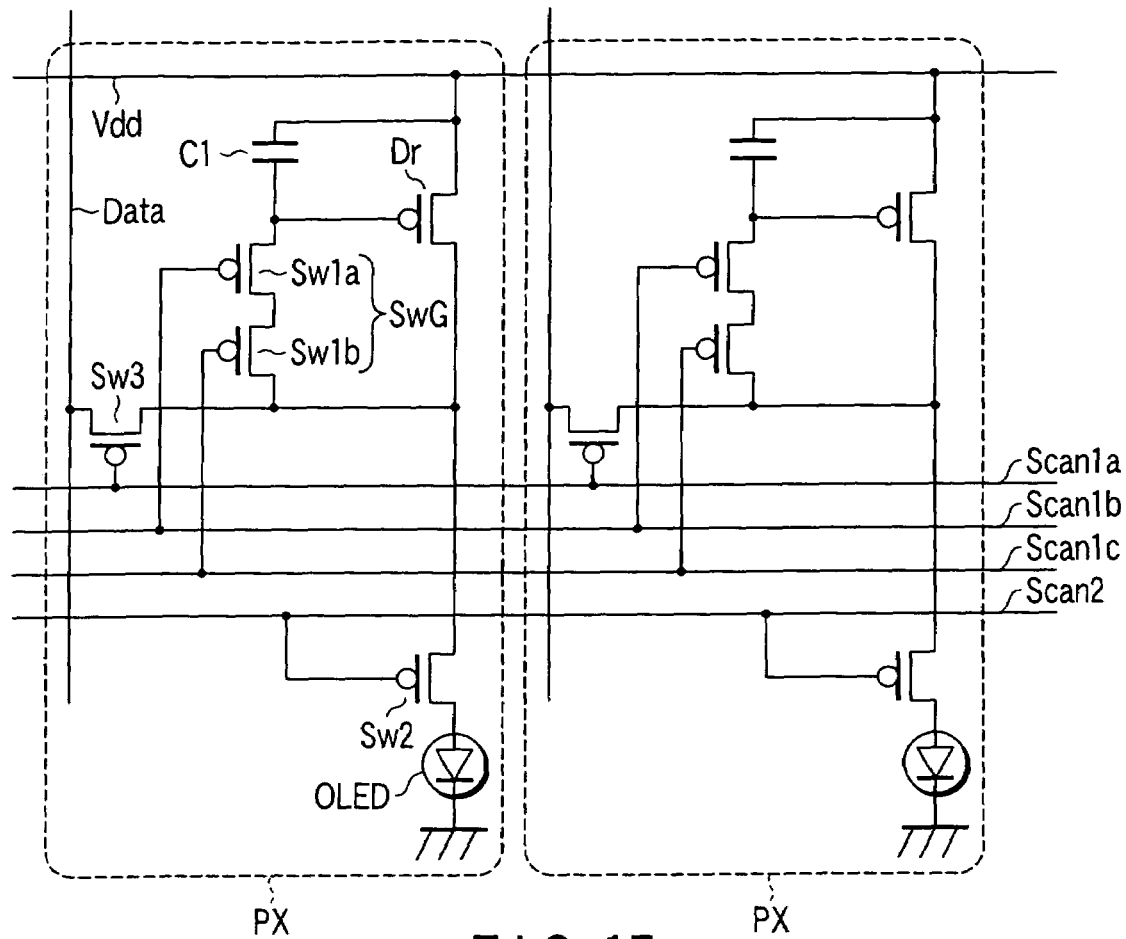
FIG. 17 is an equivalent circuit diagram showing an example of a pixel circuit which can be employed in an active matrix organic EL display according to the fourth embodiment of the present invention.

FIG. 17 is an equivalent circuit diagram showing an example of a pixel circuit which can be employed in an active matrix organic EL display according to the fourth embodiment of the present invention. In this example, each switch group SwG includes switches Sw1a and Sw1b. In this example, scan signal lines Scan1a to Scan1c are arranged in place of a scan signal line Scan1.

The control terminal of a switch Sw3 is connected to a scan signal line driving circuit YDR through the scan signal line Scan1a. The control terminal of the switch Sw1a is connected to the scan signal line driving circuit YDR through the scan signal line Scan1b. The control terminal of the switch Sw1b is connected to the scan signal line driving circuit YDR through the scan signal line Scan1c. As an example, p-channel TFTs are used as the switches Sw1a, Sw1b, Sw2, and Sw3 and drive control element Dr.

The driving method of an organic EL display 1 will be described next with reference to FIG. 18.

Figure 18:
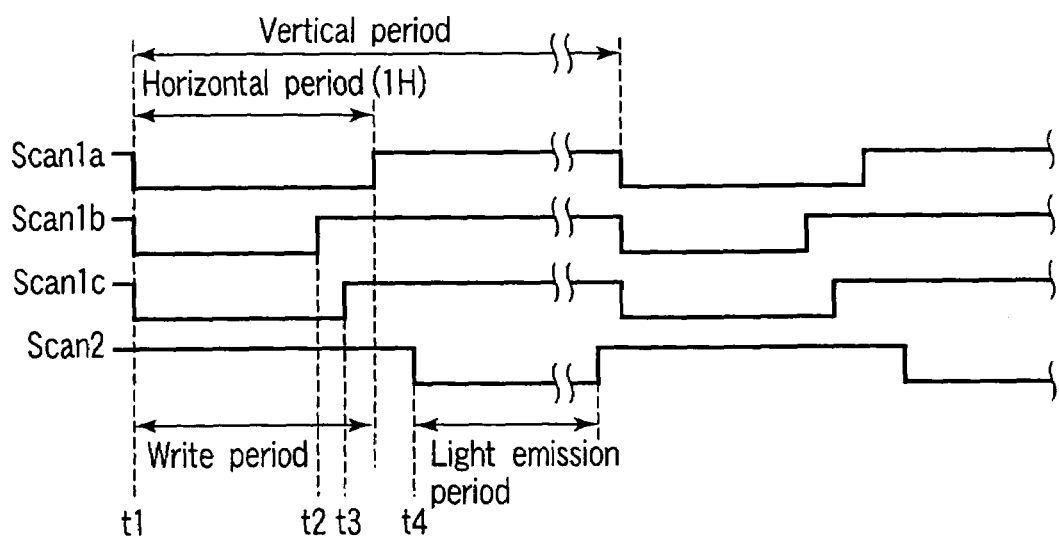
FIG. 18 is a timing chart showing an example of the driving method of the organic EL display which employs the pixel circuit shown in FIG. 17 for pixels.

FIG. 18 is a timing chart showing an example of the driving method of the organic EL display which employs the pixel circuit shown in FIG. 17 for pixels. Referring to FIG. 18, "Scan1a", "Scan1b", "Scan1c", and "Scan2" indicate the waveforms of scan signals supplied from the scan signal line driver YDR to the scan signal lines Scan1a, Scan1b, Scan1c, and Scan2, respectively.

During the write period, first, an OFF signal (in this case, a scan signal of High level) which sets the switch Sw2 in an unselected state is supplied from the scan signal line driver YDR to the scan signal line Scan2 connected to a pixel PX to be selected. In this state, an ON signal (in this case, a scan signal of Low level) which sets the switches Sw1a, Sw1b, and Sw3 in a selected state is supplied to the scan signal lines Scan1a to Scan1c connected to the pixel PX. Accordingly, the switch Sw2 is set in the nonconductive state, and the switches Sw1a, Sw1b, and Sw3 are set in the conductive state.

In this state, a constant current having a magnitude equal to a video signal current $I_{in}$ is supplied by the video signal line driver XDR to a conductive path from the power supply line Vdd to the video signal line driver XDR via the drive control element Dr, switch Sw3, and video signal line Data. Since the switches Sw1a and Sw1b are in the conductive state, the potential difference (gate-to-source voltage) between the power supply line Vdd and the control terminal of the drive control element Dr is set to a value corresponding to the current $I_{in}$.

After that, first, an OFF signal (in this case, a scan signal of High level) which sets the switch Sw1a in the unselected state is supplied to the scan signal line Scan1b to set the switch Sw1a in the nonconductive state. Next, an OFF signal (in this case, a scan signal of High level) which sets the switch Sw1b in the unselected state is supplied to the scan signal line Scan1c to set the switch Sw1b in the nonconductive state. Finally, an OFF signal (in this case, a scan signal of High level) which sets the switch Sw3 in the unselected state is supplied to the scan signal line Scan1a to set the switch Sw3 in the nonconductive state.

The gate-to-source voltage of the drive control element Dr set in correspondence with the current $I_{in}$ is held by the capacitor C1. The write period is thus ended.

Next, an ON signal (in this case, a scan signal of Low level) which sets the switch Sw2 in the selected state is supplied to the scan signal line Scan2 to set the switch Sw2 in the conductive state. Since the gate-to-source voltage of the drive control element Dr is set as described above, a current having almost the same magnitude as the current $I_{in}$ flows to the organic EL element OLED. Accordingly, the light emission period starts. Note that the light emission period continues until an OFF signal which sets the switch Sw2 in the unselected state is supplied before the start of the next write period.

In this embodiment as well, the same effect as in the first embodiment can be obtained, and a very high display quality can be implemented.

In this embodiment, the channel area of the switch Sw1a can be smaller than that of the switch Sw1b. For example, the switches Sw1a and Sw1b may have the same channel width, and a channel length La of the switch Sw1a may be shorter than a channel length Lb of the switch Sw1b. With this structure, as described in the second embodiment, the gate potential variation of the drive control element Dr can more effectively be prevented.

In the fourth embodiment, to reduce the number of scan lines, part of the scan lines which controls the switching operation of the switch group SwG and the scan line which controls the switching operation of the switch Sw3 can commonly be used.

Figure 19:
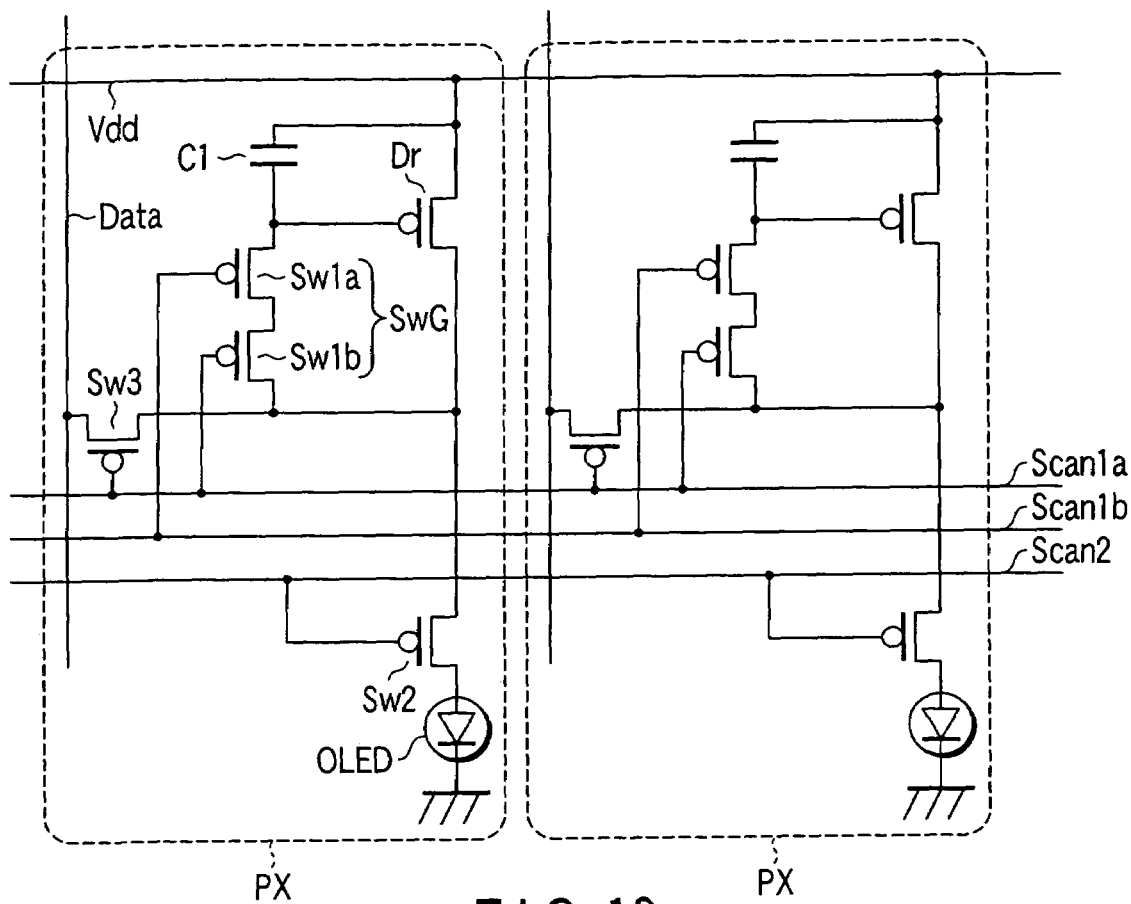
FIG. 19 is an equivalent circuit diagram showing another example of the pixel circuit which can be employed in the organic EL display according to the fourth embodiment of the present invention.

FIG. 19 is an equivalent circuit diagram showing another example of the pixel circuit which can be employed in the organic EL display according to the fourth embodiment of the present invention. In the pixel circuit shown in FIG. 19, the control terminal of the switch Sw1b is connected to the scan signal line Scan1a, and the scan signal line Scan1c is omitted.

Figure 20:
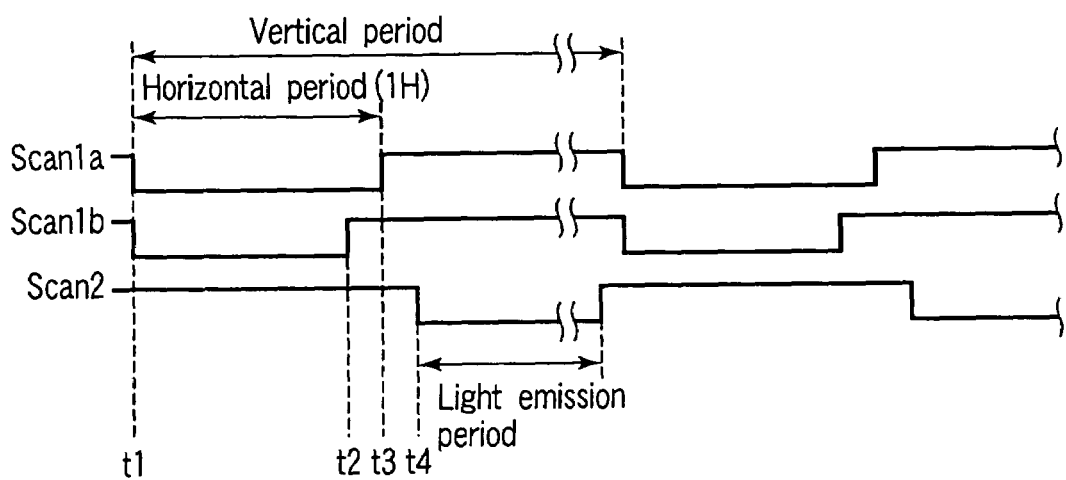
FIG. 20 is a timing chart showing an example of the driving method of the organic EL display which employs the pixel circuit shown in FIG. 19 for pixels.

FIG. 20 is a timing chart showing an example of the driving method of the organic EL display which employs the pixel circuit shown in FIG. 19 for pixels. As is apparent from comparison between FIGS. 18 and 20, the organic EL display 1 which employs the pixel circuit shown in FIG. 19 for pixels can be driven by the same method as described with reference to FIG. 18 except that the switches Sw1b and Sw3 simultaneously perform the switching operation by using the scan signal line Scan1a. Hence, also in this embodiment, the same effect as described with reference to FIGS. 17 and 18 can be obtained.

When the switches Sw2 and Sw3 are formed from TFTs of different conductivity types, the number of scan lines can further be reduced.

Figure 21:
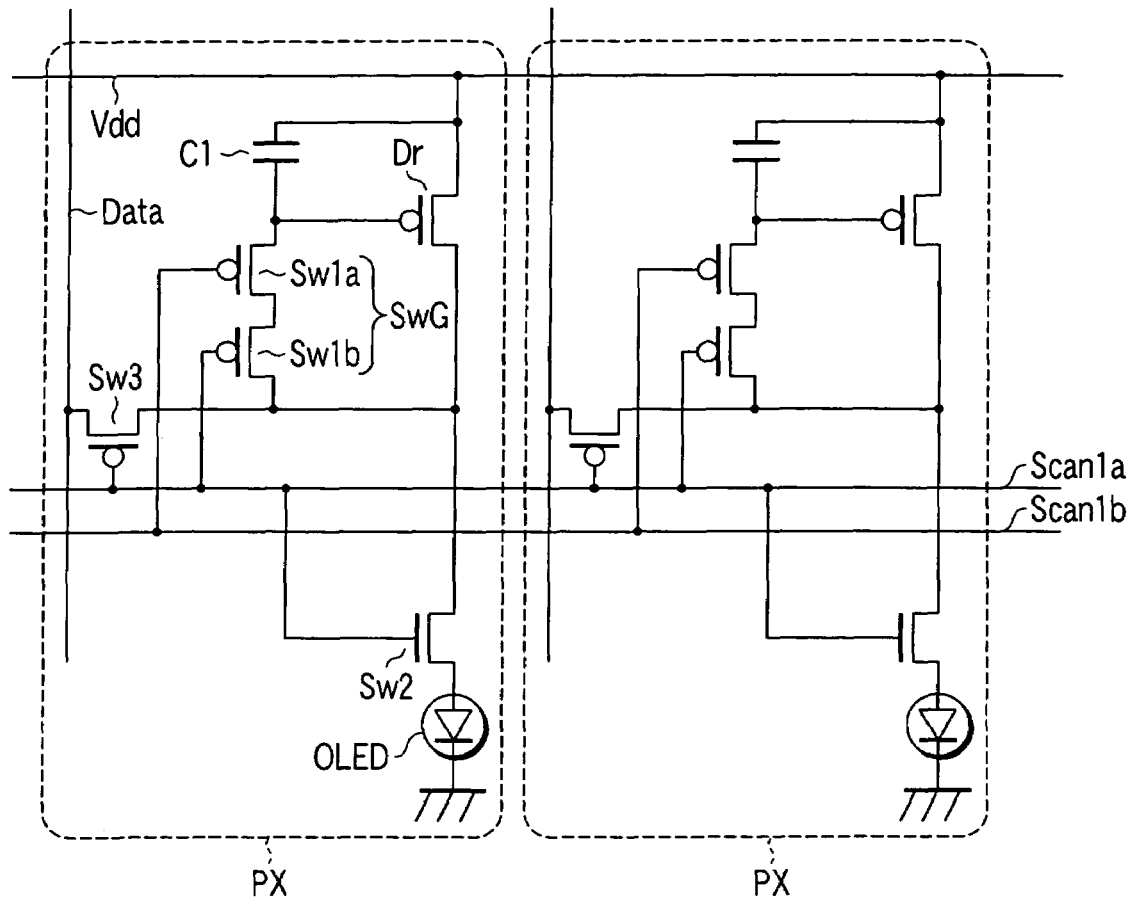
FIG. 21 is an equivalent circuit diagram showing another example of the pixel circuit which can be employed in the organic EL display according to the fourth embodiment of the present invention.

FIG. 21 is an equivalent circuit diagram showing another example of the pixel circuit which can be employed in the organic EL display according to the fourth embodiment of the present invention. In this example, the control terminals of the switches Sw1b and Sw2 are connected to the scan signal line Scan1a, and the scan signal lines Scan1c and Scan2 are omitted. In this example, transistors of the same conductivity type are used as the switches Sw1b and Sw3. As an example, p-channel TFTs are used as the drive control element Dr and the switches Sw1a, Sw1b, and Sw3, and an n-channel TFT is used as the switch Sw2.

Figure 22:
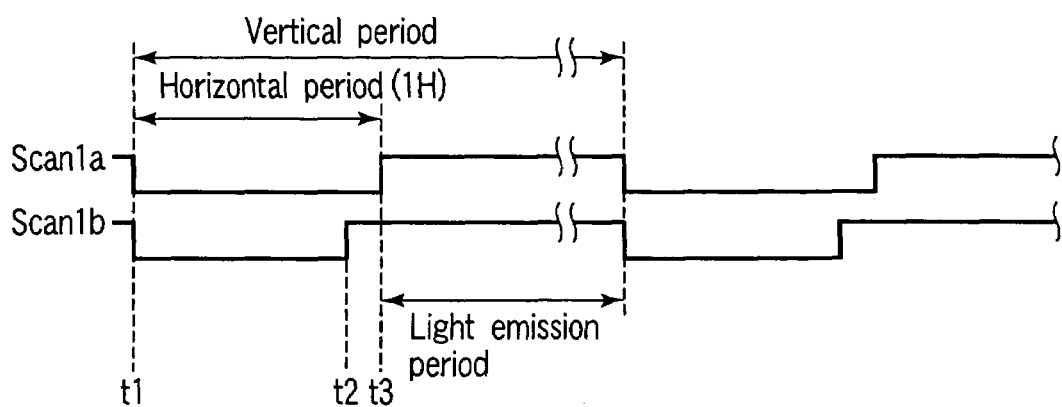
FIG. 22 is a timing chart showing an example of the driving method of the organic EL display which employs the pixel circuit shown in FIG. 21 for pixels.

FIG. 22 is a timing chart showing an example of the driving method of the organic EL display which employs the pixel circuit shown in FIG. 21 for pixels. As is apparent from comparison between FIGS. 20 and 22, the organic EL display 1 which employs the pixel circuit shown in FIG. 21 for pixels can be driven by the same method as described with reference to FIG. 20 except that the switching operation is controlled by supplying the same scan signal to the switches Sw1b, Sw2, and Sw3 by using the scan signal line Scan1a. Hence, even in this example, the same effect as described with reference to FIGS. 17 to 20 can be obtained.

The fifth embodiment of the present invention will be described next. In the fourth embodiment, the pixel PX employs a current driving type pixel circuit. In the fifth embodiment, a pixel PX employs a voltage driving type pixel circuit. Except for this point, the fifth embodiment is the same as the fourth embodiment.

Figure 23:
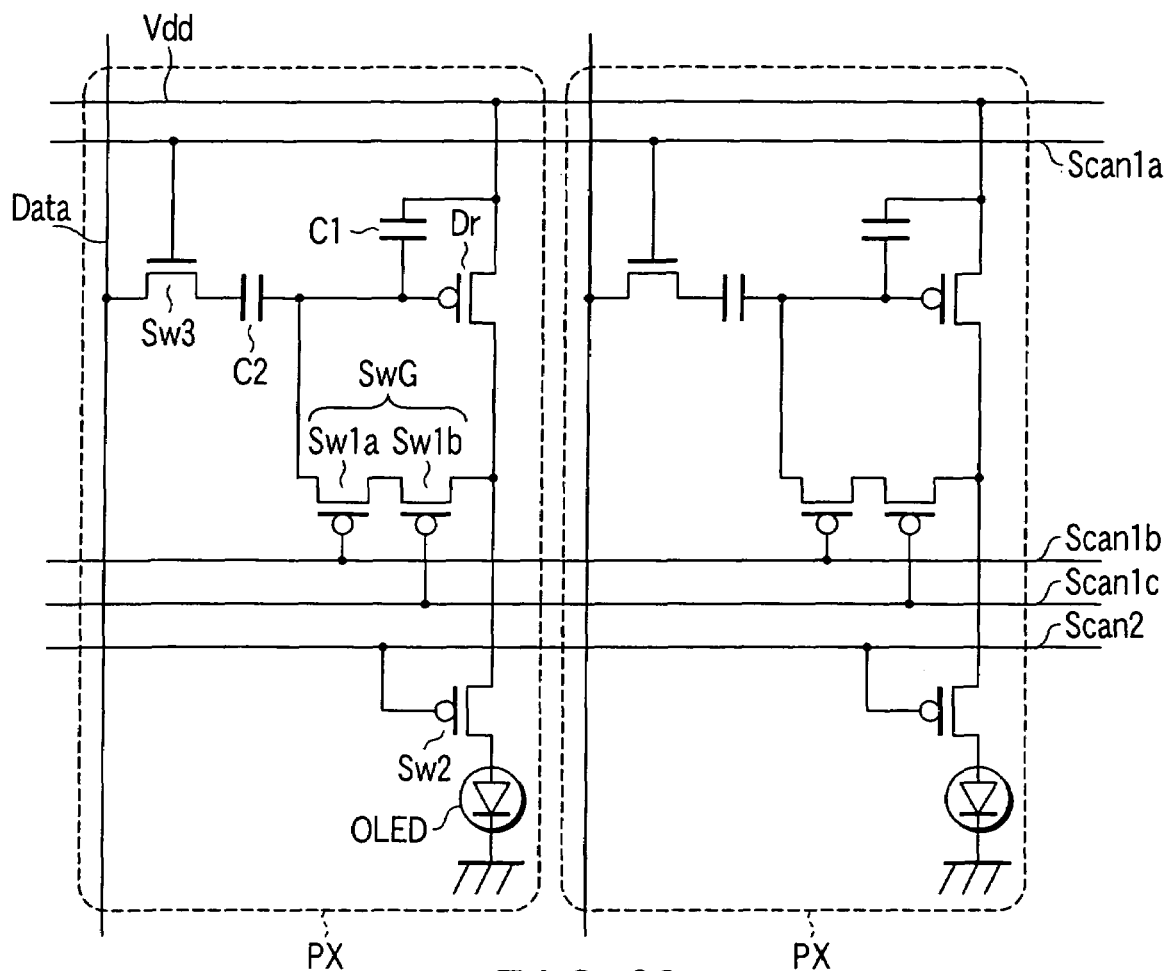
FIG. 23 is an equivalent circuit diagram showing an example of a pixel circuit which can be employed in an organic EL display according to the fifth embodiment of the present invention.

FIG. 23 is an equivalent circuit diagram showing an example of a pixel circuit which can be employed by an organic EL display according to the fifth embodiment of the present invention. The pixel PX includes an organic EL element OLED, a drive control element Dr, a capacitor C1, a capacitor C2, a switch group SwG formed by connecting a plurality of switches in series, a switch Sw2, and a switch Sw3. As an example, the switch group SwG includes two switches Sw1a and Sw1b. As an example, p-channel TFTs are used as the drive control element Dr, switches Sw1a, Sw1b, and Sw2, and an n-channel TFT is used as the switch Sw3.

The drive control element Dr, switch Sw2, and organic EL element OLED are connected in this order in series between a power supply line Vdd and a power supply line Vss.

The capacitor C1 is connected between the power supply line Vdd and the gate as the control terminal of the drive control element Dr.

The switches Sw1a and Sw1b are connected in series between the control terminal of the drive control element Dr and the terminal of the drive control element Dr, which is connected to the switch Sw2. The control terminal of the switch Sw1a is directly connected to a scan signal line Scan1b. On the other hand, the control terminal of the switch Sw1b is connected to a scan signal line Scan1c.

The control terminal of the switch Sw2 is connected to a scan signal line Scan2.

The switch Sw3 and capacitor C2 are connected in series between a video signal line Data and the control terminal of the drive control element Dr. The control terminal of the switch Sw3 is connected to a scan signal line Scan1a.

When the pixel PX employs the pixel circuit shown in FIG. 23, a video signal line driving circuit XDR capable of supplying, as a video signal, a voltage signal to the video signal line Data is used.

In an organic EL display 1 which employs the pixel circuit shown in FIG. 23 for the pixels PX, a substrate 2, scan signal lines Scan1a to Scan1c and Scan2, video signal lines Data, power supply line Vdd, switches Sw1a, Sw1b, Sw2, and Sw3, drive control elements Dr, and capacitors C1 and C2 form an active matrix substrate. This active matrix substrate can also include a scan signal line driver YDR and the video signal line driver XDR. This active matrix substrate can also include one electrode of each organic EL element OLED.

The driving method of the organic EL display 1 will be described next.

Figure 24:
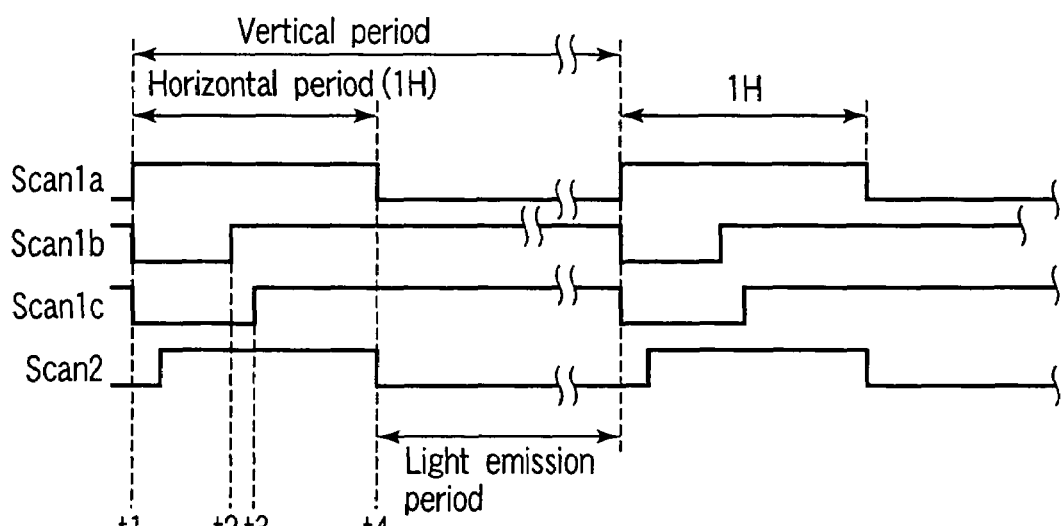
FIG. 24 is a timing chart showing an example of the driving method of the organic EL display which employs the pixel circuit shown in FIG. 23 for pixels.

FIG. 24 is a timing chart showing an example of the driving method of the organic EL display which employs the pixel circuit shown in FIG. 23 for pixels.

During the write period, first, an ON signal which sets the switches Sw1a, Sw1b, and Sw3 in a selected state is supplied from the scan signal line driver YDR to the scan signal lines Scan1a to Scan1c connected to the pixel PX to be selected. In addition, an OFF signal which sets the switch Sw2 in an unselected state is supplied to the scan signal line Scan2 connected to the pixel PX. Accordingly, the switch Sw2 is set in the nonconductive state, and the switches Sw1a, Sw1b, and Sw3 are set in the conductive state.

In this state, the potential of the video signal line Data is set to a reset signal voltage $V_{rst}$ by the video signal line driver XDR. Since the switches Sw1a and Sw1b are in the conductive state, the potential difference (gate-to-source voltage) between the power supply line Vdd and the control terminal of the drive control element Dr is set to a threshold voltage $V_{th}$ of the drive control element Dr.

After that, an OFF signal which sets the switch Sw1a in the unselected state is supplied to the scan signal line Scan1b. Next, an OFF signal which sets the switch Sw1b in the unselected state is supplied to the scan signal line Scan1c to set the switch Sw1b in the nonconductive state.

Subsequently, a video signal $V_{in}$ is supplied from the video signal line driver XDR to the video signal line Data. For example, if the electrostatic capacitances of the capacitors C1 and C2 equal each other, the gate potential of the drive control element Dr varies from the threshold voltage $V_{th}$ by an amount equal to the change amount from $V_{rst}$ to $V_{in}$.

Next, an OFF signal which sets the switch Sw3 in the unselected state is supplied to the scan signal line Scan1a to set the switch Sw3 in the nonconductive state. Simultaneously, an ON signal which sets the switch Sw2 in the selected state is supplied to the scan signal line Scan2 to set the switch Sw2 in the conductive state. Since the gate-to-source voltage of the drive control element Dr is set as described above, a current having a magnitude corresponding to the difference between $V_{rst}$ and $V_{in}$ flows to the organic EL element OLED. Accordingly, the light emission period starts. Note that the light emission period continues until the next write period starts.

As is apparent from the above description, also in this embodiment, the same effect as in the first embodiment can be obtained, and a very high display quality can be implemented.

Figure 25:
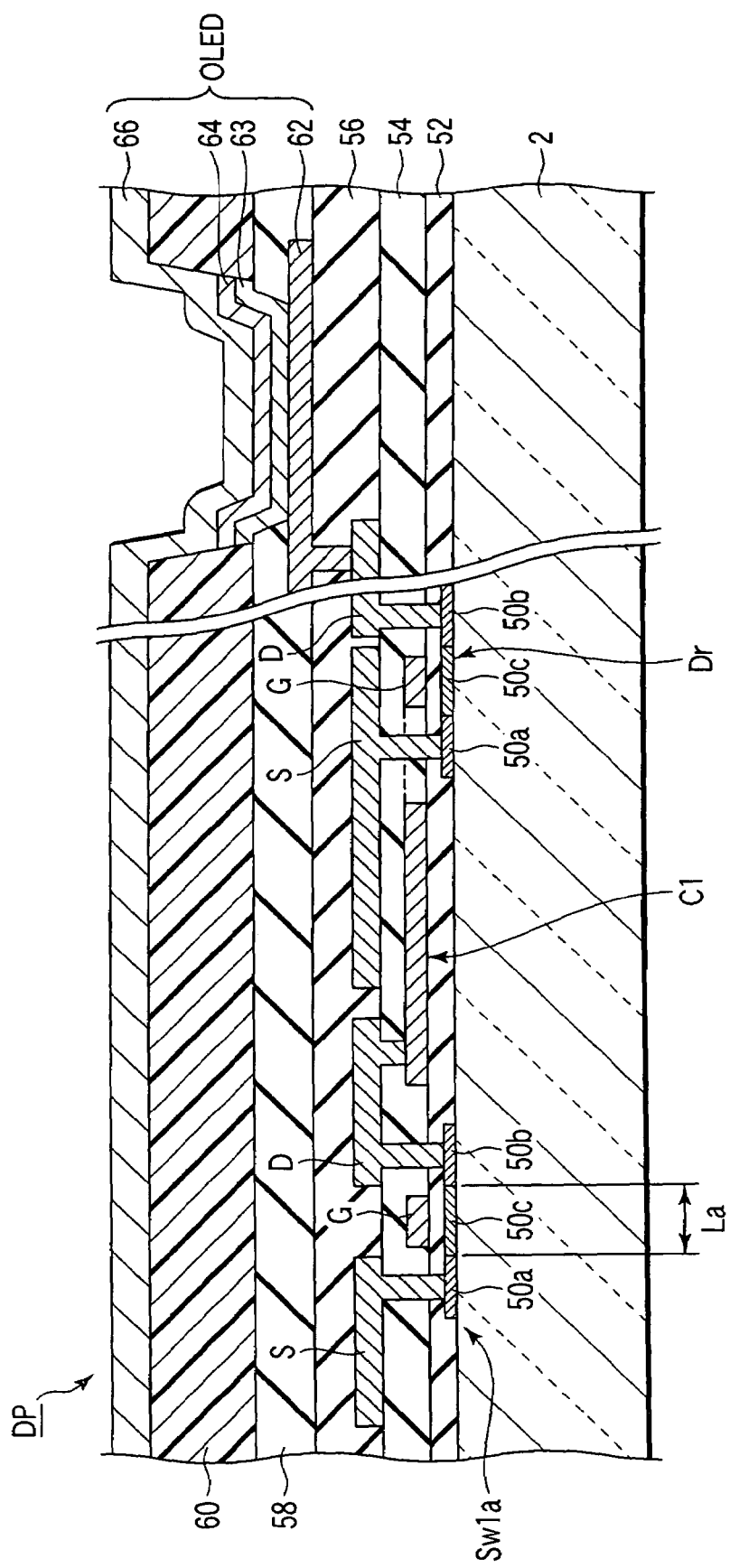
FIG. 25 is a sectional view schematically showing an example of a structure which can be employed in the organic EL panels according to the first to fifth embodiments.

FIG. 25 is a sectional view schematically showing an example of a structure which can be employed in the organic EL panels according to the first to fifth embodiments. FIG. 25 shows a section which crosses the switch Sw1a, drive control element Dr, and organic EL element OLED of the organic EL display DP.

The organic EL panel DP includes the optically transparent insulating substrate 2 such as a glass substrate. Light emitted from the organic EL element OLED is extracted outside the organic EL panel DP through, e.g., the optically transparent insulating substrate 2.

Patterned semiconductor layers are arranged on the insulating substrate 2. These semiconductor layers are, e.g., polysilicon layers.

In each semiconductor layer, the source 50a and drain 50b of a TFT are formed while being spaced apart from each other. The region 50c between the source 50a and drain 50b in the semiconductor layer is used as a channel.

The gate insulating film 52, first conductive pattern, and insulating film 54 are sequentially formed on the semiconductor layer. The first conductive pattern is used as the gate G of the TFT, the first electrode of the capacitor C1, the scan signal lines Scan1 and Scan2, and interconnections which connect these components. The insulating film 54 is used as an interlayer dielectric film and the dielectric layer of the capacitor C1.

A second conductive pattern is formed on the insulating film 54. The second conductive pattern is used as the source electrode S, drain electrode D, the second electrode of the capacitor C1, the video signal line Data, and interconnections which connect these components. The source electrode S and drain electrode D are connected to the source 50a and drain 50b of the TFT, respectively, via through holes formed in the insulating films 52 and 54.

A passivation film 56 and an anode 62 of the organic EL element OLED are sequentially formed on the second conductive pattern and insulating film 54. The anode 62 is connected to the drain D of the switch Sw2 via a through hole formed in the passivation film 56. In this example, an optically transparent conductor such as ITO (Indium Tin Oxide) is used as the material of the anode 62.

An insulating layer 58 is formed on the passivation film 56. The insulating layer 58 has a through hole at a position corresponding to the central portion of the anode 62. The insulating layer 58 is, e.g., an inorganic insulating layer having a lyophilic effect.

An insulating layer 60 is formed on the insulating layer 58. The insulating layer 60 has a through hole having a diameter larger than that in the insulating layer 58 at a position corresponding to the central portion of the anode 62. The insulating layer 60 is, e.g., an organic insulating layer having a liquid repellent effect. The multilayered body of the insulating layer 58 and insulating layer 60 form a partition insulating layer having a through hole at a position corresponding to the anode 62.

A buffer layer 63 and a light-emitting layer 64 are sequentially formed on the anode 62 exposed in the through hole in the partition insulating layer. The buffer layer 63 serves to mediate hole injection from the anode 62 to the light-emitting layer 64. The light-emitting layer 64 is a thin film containing a luminescent organic compound which emits light of red, green, or blue.

A cathode 66 is formed on the partition insulating layer and light-emitting layer 64 as an electrode common to all pixels. The cathode 66 is connected to the power supply line Vss through a contact hole (not shown) formed in the passivation film 56 and partition insulating layer. As the cathode 66, for example, a multilayered body including a main conductive layer containing barium or the like and a protective conductive layer containing aluminum or the like is used. Each organic EL element OLED includes the anode 62, buffer layer 63, light-emitting layer 64, and cathode 66.

The light emitted by the light-emitting layer 64 may be extracted from the side of the cathode 66 to the outside of the organic EL panel DP. In this case, the cathode 66 is optically transparent.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An active matrix organic EL display comprising:
    a drive control element which includes a first terminal connected to a first power supply terminal, a control terminal, and a second terminal which outputs a driving current having a magnitude corresponding to a voltage between the first terminal and the control terminal;
    a capacitor which has one electrode connected to the control terminal and can maintain the voltage between the first terminal and the control terminal constant;
    an organic EL element which is connected between the second terminal and a second power supply terminal; and
    a plurality of first switches which are connected in series between the second terminal and the control terminal.

2. A display according to claim 1, wherein, of said plurality of first switches connected in series, the first switch located at an end on a side of the control terminal is configured to cause switching from a conductive state to a nonconductive state in accordance with a change in magnitude of a scan signal earlier than the remaining first switch.

3. A display according to claim 2, wherein control terminals of said plurality of first switches are connected to a single scan signal input terminal.

4. A display according to claim 3, wherein said plurality of first switches are field effect transistors of the same conductivity type, and of said plurality of first switches connected in series, the first switch located at the end on the control terminal side has a threshold value deeper than that of the remaining first switch.

5. A display according to claim 3, wherein said plurality of first switches are field effect transistors of the same conductivity type, and of said plurality of first switches connected in series, the first switch located at the end on the control terminal side has a channel length longer than that of the remaining first switch.

6. A display according to claim 1, further comprises a delay element which delays and outputs an input signal,
    wherein, of said plurality of first switches, a control terminal of the first switch located at an end on a side of the control terminal of the drive control element is directly connected to a scan signal input terminal, and a control terminal of the remaining first switch is connected to the scan signal input terminal through the delay element.

7. A display according to claim 6, wherein the delay element is a resistive element.

8. A display according to claim 7, wherein the resistive element is a polysilicon pattern.

9. A display according to claim 6, wherein the delay element is a diode.

10. A display according to claim 6, wherein the delay element comprises a first diode and a second diode which are connected in parallel, and a forward direction of the first diode is reverse to that of the second diode.

11. A display according to claim 2, further comprises a first scan signal input terminal and a second scan signal input terminal,
wherein, of said plurality of first switches, the first switch located at an end on a side of the control terminal is connected to the first scan signal input terminal, the remaining first switch is connected to the second scan signal input terminal, and the first switch located at the end on the control terminal side has a channel area smaller than that of the remaining first switch.

12. An active matrix organic EL display comprising:
a drive control element which includes a first terminal connected to a first power supply terminal, a control terminal, and a second terminal which outputs a driving current having a magnitude corresponding to a voltage between the first terminal and the control terminal;
a capacitor which has one electrode connected to the control terminal and can maintain the voltage between the first terminal and the control terminal constant;
an organic EL element which is connected between the second terminal and a second power supply terminal; and
a plurality of first switches which are connected in series between the second terminal and the control terminal,
said plurality of first switches being field effect transistors of the same conductivity type and having gates connected to a single scan signal input terminal, and of said plurality of first switches connected in series, the first switch located at an end on a side of the control terminal having a threshold value deeper than that of the remaining first switch.

13. A display according to claim 12, wherein, of said plurality of first switches connected in series, the first switch located at the end on the control terminal side and the remaining first switch have a threshold value difference which falls within a range of 0.1V to 0.8V.

14. An active matrix organic EL display comprising:
a drive control element which includes a first terminal connected to a first power supply terminal, a control terminal, and a second terminal which outputs a driving current having a magnitude corresponding to a voltage between the first terminal and the control terminal;
a capacitor which has one electrode connected to the control terminal and can maintain the voltage between the first terminal and the control terminal constant;
an organic EL element which is connected between the second terminal and a second power supply terminal; and
a plurality of first switches which are connected in series between the second terminal and the control terminal,
said plurality of first switches being field effect transistors of the same conductivity type and having gates connected to a single scan signal input terminal, and of said plurality of first switches connected in series, the first switch located at an end on a side of the control terminal having a channel length longer than that of the remaining first switch.

15. A display according to claim 14, wherein, of said plurality of first switches connected in series, the first switch located at the end on the control terminal side has a channel length which falls within a range of 1.3 to 3.0 times that of the remaining first switch.

16. An active matrix organic EL display comprising:
a drive control element which includes a first terminal connected to a first power supply terminal, a control terminal, and a second terminal which outputs a driving current having a magnitude corresponding to a voltage between the first terminal and the control terminal;
a capacitor which has one electrode connected to the control terminal and can maintain the voltage between the first terminal and the control terminal constant;
an organic EL element which is connected between the second terminal and a second power supply terminal;
a plurality of first switches which are connected in series between the second terminal and the control terminal;
a first scan signal terminal which is connected to, of said plurality of first switches, a control terminal of the first switch located at an end on a side of the control terminal; and
a second scan signal terminal which is connected to a control terminal of the remaining first switch of said plurality of first switches,
said plurality of first switches being field effect transistors of the same conductivity type, and of said plurality of first switches connected in series, the first switch located at the end on the control terminal side having a channel area smaller than that of the remaining first switch.

17. An active matrix substrate comprising:
a drive control element which includes a first terminal connected to a first power supply terminal, a control terminal, and a second terminal which outputs a driving current having a magnitude corresponding to a voltage between the first terminal and the control terminal and should be connected to a second power supply terminal through an organic EL element;
a capacitor which has one electrode connected to the control terminal and can maintain the voltage between the first terminal and the control terminal constant; and
a plurality of switches which are connected in series between the second terminal and the control terminal.

* * * * *